(12) United States Patent
Kamitani

(10) Patent No.: US 7,375,534 B2
(45) Date of Patent: May 20, 2008

(54) METHOD AND APPARATUS FOR MEASURING HIGH-FREQUENCY ELECTRICAL CHARACTERISTICS OF ELECTRONIC DEVICE, AND METHOD FOR CALIBRATING APPARATUS FOR MEASURING HIGH-FREQUENCY ELECTRICAL CHARACTERISTICS

(75) Inventor: Gaku Kamitani, Kyoto-fu (JP)

(73) Assignee: Murata Manufacturing Co., Ltd. (JP)

( * ) Notice: Subject to any disclaimer, the term of this patent is extended or adjusted under 35 U.S.C. 154(b) by 49 days.

(21) Appl. No.: 11/536,915

(22) Filed: Sep. 29, 2006

(65) Prior Publication Data

US 2007/0030012 A1 Feb. 8, 2007

Related U.S. Application Data

(63) Continuation of application No. PCT/JP2004/019086, filed on Dec. 21, 2004, and a continuation of application No. PCT/JP2004/004882, filed on Apr. 2, 2004.

(51) Int. Cl.
*G01R 27/28* (2006.01)
*G01R 35/00* (2006.01)
*G01D 18/00* (2006.01)

(52) U.S. Cl. ............ 324/650; 324/649; 324/601; 702/85

(58) Field of Classification Search ........ 324/650, 324/649, 600, 601, 202, 130, 74, 500, 629, 324/637, 638, 615; 702/85, 90, 104, 107, 702/117, 118, 182, 189
See application file for complete search history.

(56) References Cited

U.S. PATENT DOCUMENTS 4,858,160 A * 8/1989 Strid et al. .............. 702/106

(Continued)

FOREIGN PATENT DOCUMENTS

JP 6-34686 2/1994
JP 10-197577 7/1998

OTHER PUBLICATIONS

Written Opinion.

(Continued)

*Primary Examiner*—Vincent Q. Nguyen
*Assistant Examiner*—Hoai-An D. Nguyen
(74) *Attorney, Agent, or Firm*—Ostrolenk, Faber, Gerb & Soffen, LLP

(57) ABSTRACT

A plurality of signal conductors and ground conductors are connected to associated measurement ports of a network analyzer. A short standard is connected between each of the signal conductors and the ground conductor at least three points in the longitudinal direction of each of the signal conductors, and an electrical characteristic is measured. A through chip is connected in series between the signal conductors, and electrical characteristics are measured. Error factors of a measurement system including a transmission line are calculated. An electronic device to be measured is connected between the signal conductors or among the signal conductors and the ground conductors, and electrical characteristics are measured. The error factors of the measurement system are removed from the measured values, thereby obtaining true values of the electrical characteristics of the electronic device to be measured. Accordingly, a highly accurate high-frequency electrical characteristic measuring method that is not affected by connection variations can be implemented.

25 Claims, 8 Drawing Sheets

U.S. PATENT DOCUMENTS

| | | | |
|---|---|---|---|
| 5,159,262 A * | 10/1992 | Rumbaugh et al. | 324/765 |
| 6,838,885 B2 * | 1/2005 | Kamitani | 324/601 |
| 6,960,920 B2 * | 11/2005 | Kamitani | 324/601 |
| 2007/0029990 A1 * | 2/2007 | Kamitani | 324/76.22 |
| 2007/0040561 A1 * | 2/2007 | Kamitani | 324/601 |

OTHER PUBLICATIONS

International Search Report issued Apr. 26, 2005.

* cited by examiner

METHOD AND APPARATUS FOR MEASURING HIGH-FREQUENCY ELECTRICAL CHARACTERISTICS OF ELECTRONIC DEVICE, AND METHOD FOR CALIBRATING APPARATUS FOR MEASURING HIGH-FREQUENCY ELECTRICAL CHARACTERISTICS

CROSS-REFERENCE TO RELATED APPLICATIONS

This is a continuation of PCT/JP2004/004882 filed Apr. 2, 2004 and PCT/JP2004/019086 filed Dec. 21, 2004, both incorporated by reference.

BACKGROUND OF THE INVENTION

1. Technical Field

The present invention relates to a method and apparatus for measuring high-frequency electrical characteristics of an electronic device, such as a filter, a coupler, a balun, or the like, or an impedance device, such as a chip inductor, a chip capacitor, or the like. More specifically, the present invention relates to a method for correcting a measurement error in measuring scattering parameters or the impedance of the electronic device using a measuring device, such as a network analyzer or the like.

2. Background Art

To measure high-frequency electrical characteristics of a surface-mounted filter, a surface-mounted coupler, or an impedance device such as a chip inductor using a network analyzer, it is impossible to directly connect coaxial cables to the electronic device. Therefore, generally a planar transmission line (such as a microstrip line or a coplanar waveguide) is connected to the network analyzer via coaxial cables or the like, and the electronic device is brought into contact with the planar transmission line to make a measurement. In this case, in order to obtain true values of a scattering parameter matrix of the impedance device serving as a test object, it is necessary to identify error factors of a measurement system and to remove the effects of the error factors from the measurement results. This is referred to as correction or calibration.

In the measurement using a network analyzer, as shown in Application Note 1287-9; In-Fixture Measurements Using Vector Network Analyzers (©1999 Hewlett-Packard Company) (non-patent document 1), TRL (Through-Reflection-Load) calibration and SOLT (Short-Open-Load-Through) calibration are known as techniques for removing errors of the measurement system.

FIGS. 1 and 2 show respective measurement systems using a network analyzer and corresponding error models for use in SOLT calibration and TRL calibration.

An electronic device 1 serving as a test object is connected to a transmission line provided on the top surface of a measuring fixture 2. Two ends of the transmission line on the measuring fixture 2 are connected to measurement ports of the network analyzer, which is not shown, via coaxial cables 3.

In the error model of SOLT calibration, $S_{11A}$, $S_{21A}$, $S_{12A}$ and $S_{22A}$ are scattering parameters of the transmission line including the test object, $E_{DF}$, $E_{RF}$, and $E_{SF}$ are scattering parameters on one measurement port side, and $E_{LF}$ and $E_{TF}$ are scattering parameters on the other measurement port side.

In the error model of TRL calibration, $S_{11A}$, $S_{21A}$, $S_{12A}$ and $S_{22A}$ are scattering parameters of the test object, $e_{00}$, $e_{01}$, $e_{01}$ and $e_{11}$ are scattering parameters on one measurement port side, and $f_{00}$, $f_{10}$, $f_{01}$ and $f_{11}$ are scattering parameters on the other measurement port side.

In order to identify error factors, it is preferable to fix at least three types of devices (standards) whose scattering parameters are known, to a test object measuring plane and make measurements. Traditionally, opens, shorts, and terminations (loads) (=50Ω) are often used. Since these standards can be implemented in a coaxial environment, this method, which is referred to as SOLT calibration, is widely used. In SOLT calibration, as shown in FIG. 3, three types of connectors 4 including a short (0Ω), an open (∞Ω), and a termination (50Ω) are used, and the ports are directly connected to each other to achieve a through state.

However, in the case of SOLT calibration, it is very difficult to implement these standards in environments other than the coaxial environment, and the standards necessary for calibration cannot be fabricated in the form of a chip device. For example, a planar transmission line for use in measuring a surface-mounted device is, unlike a waveguide or a coaxial transmission line, unable to achieve a satisfactory "open" or "termination", and it is thereby practically impossible to perform SOLT calibration. Also, in general, measured values obtained by measurements are not characteristics of the test object 1 alone, but are composite characteristics of the test object 1 and the measuring fixture 2 to which the test object is connected. It is thus impossible to measure characteristics of the test object alone.

TRL calibration, as shown in FIG. 4, instead of device-shaped standards that are difficult to realize, employs as standards a (through) transmission line 5a whose ports are directly connected to each other, a total reflection (reflection=normally shorted) transmission line 5b, and various types of transmission lines 5c and 5d of different lengths. With regard to the transmission lines 5a to 5d, it is relatively easy to fabricate transmission lines whose scattering parameters are known. Also, if the total reflection is achieved by shorting, it is relatively easy to estimate characteristics thereof. Therefore, these transmission lines are sufficient to perform calibration. Basically, it is possible to measure the characteristics of the test object 1 alone.

In this example, the through transmission line 5a is a so-called zero-through. To measure the test object, the test object is connected in series with the measuring fixture 2 whose length is greater than the through transmission line 5a by the length of the test object, and a measurement is made.

However, when TRL calibration is applied to a surface-mounted device serving as a test object, the following problems occur.

1) With regard to the transmission lines (several types of lines, including reflection and through lines) 5a to 5d serving as the standards, it is necessary that all the error factors generated in connections between coaxial connectors 3 and the transmission lines 5a to 5d be equivalent. However, even when the same type of connectors are used as the standards, characteristics of the standards vary greatly when the standards are connected to a measuring device, thereby generating calibration errors. It is practically impossible to perform TRL calibration near a millimeter-wave band.

2) In order to solve this problem, the coaxial connectors 3 are common among the transmission lines 5a to 5d, and coaxial pins are in contact and connected to the transmission lines serving as the standards, thereby avoiding the effects of variations in connector measurements. Structurally, however, it is difficult to ensure a sufficient pressing load at the connections, and hence the coaxial pins may be damaged.

Since the connections are unstable, calibration becomes also often unstable. The higher the measurement frequency, generally the thinner the transmission lines and the coaxial pins. Depending on the positioning repeatability thereof, measurement variations may become larger.

3) Since it is difficult to determine, in the calibration operation, whether the measurement is properly performed in the calibration, there may be a waste of time, such as a failure, e.g., poor contact at the time of the calibration, recognized upon a measurement of a test object after having completed the time-consuming calibration operation.

Japanese Unexamined Patent Application Publication No. 6-34686 (patent document 1) discloses a method for calibrating a network analyzer having two test terminals to be connected to a test object via a strip line. That is, a first calibration measurement is made to measure transmission and reflection parameters of the microstrip line whose propagation constant is unknown, which is connected between the two test terminals in a reflection-free manner. Three further calibration measurements are made using the same line and three calibration standards realized with reflection-symmetric and reciprocal discontinuous objects disposed at three different positions on the line.

That is, the three types of standards are realized by changing the state of the transmission line to three states. This way, the standards are connected only once. With this method, compared with TRL calibration, the number of times the standards are connected is reduced, and hence measurement errors in the calibration operation are reduced in number.

However, in the actual measurement of a test object, it is necessary to remove the strip line employed as the standard, and to again connect a strip line (fixture) to which the test object can be connected. Needless to say, characteristics of a reconnected portion change, resulting in measurement errors.

It is practically difficult to connect the strip line between the two test terminals in a reflection-free manner. Reflection parameters of portions in which the test terminals are connected to the strip line may cause errors.

Measured values obtained by connecting a test object are not characteristics of the test object alone, but are composite characteristics of the test object and the strip line to which the test object is connected. It is thus impossible to measure the characteristics of the test object alone.

SUMMARY OF THE INVENTION

The present invention solves these problems in TRL calibration and SOLT calibration and provides a highly accurate method for measuring high-frequency electrical characteristics of an electronic device, which is not affected by characteristic variations in connections.

The present invention also provides a highly accurate apparatus for measuring high-frequency electrical characteristics of an electronic device.

The present invention further provides a highly accurate method for calibrating a high-frequency electrical characteristic measuring apparatus.

An embodiment of the invention provides a method for measuring high-frequency characteristics of an electronic device. The method includes a step of preparing a transmission line whose electrical characteristics per unit length are known, the transmission line including a plurality of signal conductors disposed with a space therebetween, and at least one ground conductor; a step of connecting the signal conductors and the ground conductor to associated measurement ports of a measuring device; a step of measuring, at least three points in the longitudinal direction of each signal conductor, an electrical characteristic in a connection state where each signal conductor is connected to the ground conductor; a step of measuring electrical characteristics in a through state between the signal conductors; a step of obtaining error factors of a measurement system including the transmission line on the basis of measured values in the connection state, measured values in the through state, and the electrical characteristics of the transmission line; a step of connecting the electronic device to be measured between the signal conductors or among the signal conductors, and the ground conductor, and measuring electrical characteristics; and a step of removing the error factors of the measurement system from measured values of the electronic device to be measured and obtaining true values of the electrical characteristics of the electronic device to be measured.

A further embodiment of the invention provides a technique for removing errors of a measurement system including the transmission line and the like, in a method including the steps of connecting a test object in series among signal conductors and a ground conductor of a transmission line serving as a measuring fixture or connecting the test object among the signal conductors and the ground conductor, measuring reflection and transmission parameters and the like, and obtaining, on the basis of the measured values, electrical characteristics including an impedance, quality parameter, or the like. This embodiment is based on the knowledge that, in the measurement of errors of the measurement system, it is possible to achieve a satisfactory short-circuited state of the transmission line.

In a preferred example of the calibration method according to the present invention (hereinafter referred to as RRRR calibration), a short standard is employed as a calibration standard (standard). This is because, since a short-circuited state is substantially equivalent to a total reflection state, the effects of terminated ends of the signal conductors can be avoided. In the frequency range where the transmission line serving as an object operates in TEM single mode, characteristics in the short-circuited state are substantially not affected by a dielectric, and it is possible to estimate electrical characteristics of the transmission line with high accuracy using an electromagnetic field simulation.

In general, a parameter that limits the accuracy of simulated transmission line characteristics is a dielectric constant. It has been confirmed that there is only a negligible change in the calculation results of the reflection characteristics in a short-circuited state when the dielectric constant is changed. It can be said that there is no harm in assuming that the simulation results are physical true values to be used in calibration. When the width of the transmission line is sufficiently smaller than the wavelength of a measured signal, it can be regarded that no big error will be introduced by using −1 (reflection parameter of an ideal short) as a short characteristic.

The outline of RRRR calibration according to the preferred example will now be described.

Calibration Step 1: Measurement in Short-Circuited State

In RRRR calibration, a transmission line including a plurality of signal conductors with electrical characteristics uniform in the longitudinal direction is shorted at least three points on the transmission line, thereby identifying error factors of a measurement system. In order to short the transmission line, for example, a short standard is connected between each of the signal conductors and the ground conductor. Specifically, the short standard is connected to a test object measurement position, and a measurement is made. Next, the short standard is connected to a point spaced away from the test object measurement position by $L_1$, and a measurement is made. Then, the short standard is connected to a point spaced away from the test object measurement position by $L_2$, and a measurement is made. If the characteristics of the transmission line are unknown, a fourth measurement is made at another point.

The short standard refers to electrically shorted devices in general. The short standard is not limited to chip devices and includes metal pieces or tools. Preferably, the short standard has a shortlength of contact in the longitudinal direction of the transmission line, such as at the edge of a knife. If the short standard is ideal, the reflection parameter is −1 (total reflection). In reality, however, the short standard has a certain amount of inductance, and it is thus necessary that the inductance be known. In a microwave band, compared with an open state, it is generally relatively easy to achieve an almost ideal short-circuited state. If high measurement accuracy is required, the inductance of the short standard shall be obtained with a simple simulation or the like.

Calibration Step 2: Measurement in Through State

In addition to the measurement in the short-circuited state, error factors of the measurement system are identified in a through state between the signal conductors. In order to implement a through state, for example, a through chip whose transmission parameters have no directivity is connected in series. In RRRR calibration where the measurement can be performed with a series method, the ports are connected with each other to achieve a through state. Here, the characteristics of the through chip need not be known. For example, a chip resistor whose resistance is unknown can be employed. However, such a chip resistor shall not have directivity. Except for an isolator or a circulator (a special device using a magnetic material under a DC magnetic field) or an active device such as a semiconductor amplifier, it is difficult to fabricate a device having signal transmission directivity (reciprocity theorem). Thus, as a matter of fact, this assumption is automatically satisfied. The through chip is not limited to a chip device and includes any device as long as the device has no signal transmission directivity.

Measurement Step: Measurement of Test Object

The electrical characteristics of an electronic device serving as a test object are measured by connecting the electronic device in series between the signal conductors of the transmission line, or simultaneously connecting the electronic device in series between the signal conductors and to the ground conductor.

Using the measured electrical characteristics of the test object and the error factors obtained in calibration steps 1 and 2, true values of the electrical characteristics of the test object can be calculated.

In particular, when measurements are performed at four or more points in the short-circuited state, not only the error factors of the measurement system, but also the electrical characteristics of the transmission line can be obtained.

In the above description, the signal conductors and the ground conductor are shorted in the calibration step. However, it is not always necessary to short the signal conductors and the ground conductor. It is sufficient that the signal conductors be connected to the ground conductor so as to achieve some sort of a reflection state.

If a calibration standard that has transmission parameters similar to those of a chip resistor is used instead of the short standard, part of a signal entering one port passes through a portion in contact with the calibration standard and is completely reflected at an open end of the signal conductor, which may cause a measurement error. However, for example, if it is assumed that 16% (−16 dB) of the input signal passes through the portion in contact with the calibration standard, reaches the open end of the signal conductor, and is completely reflected at the open end, this error will be about −32 dB (=−16×2) in a round trip, and the error level is about 2.5% of the input signal. Therefore, if a signal flowing toward the open end is less than or equal to 16% of the input signal, the error becomes very small, and accuracy required for calibration can be achieved.

In contrast, if a signal greater than 16% passes through the portion in contact with the calibration standard, the error may be large. In such a case, as in contact detection, the port 1 and the port 2 may be connected to each other using a through chip or the like. A signal is transmitted via the through chip to the port 2 and is not completely reflected at the open end of the signal conductor. Thus, the level of the returning signal can be reduced.

The RRRR calibration implemented in the above-described manner has the following features.

(1) Calibration and measurement are performed on one and the same transmission line.

In TRL calibration, transmission lines of different lengths serving as standards are necessary, and it is also necessary that connections between the transmission lines and coaxial cables have equivalent electrical characteristics. However, in the RRRR calibration, one and the same transmission line is employed not only in calibration, but also in measurement. It is thus unnecessary to reconnect the transmission line, and the RRRR calibration is not affected by variations in characteristics of the transmission line, the connectors, and the connections.

(2) Not only the measurement of a two-terminal device can be made with a series method, but also the measurement of an electronic device with two or more ports (electronic device with three or more terminals) can be performed with no problem. A device to be measured is not limited. In particular, the accuracy of measuring an electronic device with an impedance higher than the characteristic impedance of the transmission line is high.

(3) The length of the transmission line necessary for the measuring fixture is determined by the lower limit of the frequencies to be measured. In order to handle low frequencies, a long transmission line is necessary. However, a short transmission line is sufficient to handle high frequencies.

(4) Measurements for calibration are made by performing the measurement using the calibration standard (e.g., the short standard) at a few points on the transmission line and the through measurement using an appropriate device.

The number of points at which the measurement using the calibration standard is performed and how far they are away from the test object measurement position are determined by the measurement frequency bandwidth and the upper frequency limit. It is sufficient that the through chip have no directivity, and the scattering parameters of the through chip may be unknown.

When the measurement using the calibration standard is performed at four or more points on the transmission line, the characteristics of the transmission line can also be obtained.

If the characteristics of the transmission line are known, the error factors of the measurement system can be obtained by connecting the calibration standard to three points. If the calibration standard is connected to four or more points, not only the error factors of the measurement system, but also the characteristics of the transmission line (dielectric constant, loss parameter, etc.) can be obtained. Therefore, even when the dielectric constant or loss parameter of a dielectric material for use in the transmission line fixture is unknown or even when the characteristics of a dielectric material in each lot vary, the characteristics of the transmission line fixture to be used can be accurately obtained, and highly accurate calibration can be performed without errors.

In general, transmission line fixtures made of a base material such as Teflon® or alumina have electrical characteristics that vary only slightly, and it is easy to obtain the physical true values of the electrical characteristics. However, these transmission line fixtures are expensive. In contrast, transmission line fixtures made of a base material including a general resin such as an epoxy resin or the like are inexpensive. However, material characteristics of these transmission line fixtures vary greatly, and the dielectric constant and loss parameter thereof also vary. In such a case, the calibration standard is connected to four or more points to obtain transmission line characteristics. In this way, the electrical characteristics of a test object can be measured with high accuracy without being affected by variations in the transmission line characteristics.

(6) In order to measure the impedance, it is necessary that the characteristic impedance or the like of the transmission line be known.

When it is only necessary to measure scattering parameters with reference to the characteristic impedance of the transmission line, the characteristic impedance of the transmission line need not be known. However, in order to measure the impedance or the like, it is necessary that the characteristic impedance of the transmission line be known. This may be obtained with a known method, such as calculating the impedance with a simulation or by using a value actually measured with a time domain reflectory method.

In the above description, the error factors are determined using, not only the measurement results obtained in the short-circuited state, but also the measurement results obtained using the series-connected through chip whose transmission parameters have no directivity. However, if a test object has no directivity, the test object can also be regarded as one type of through chip. Therefore, the measurement using the through chip may be omitted, and the error factors can be determined using the results of measuring the test object and the measurement results obtained in the short-circuited state.

In this case, the test object is not limited to a device with two terminals. An electronic device with three or more terminals can be used as long as the device has no directivity between the ports.

By connecting an appropriate through chip to the test object measurement point in the measurement of the short standard, poor contact of the short standard can be detected by the size of a transmission parameter. That is, if there is poor contact for some reason, the transmission parameter between the ports is increased. Thus, poor contact can be detected. In this manner, a measurement error can be detected during the calibration procedure. It is thus possible to avoid a waste of time, such as a calibration failure recognized subsequently upon the measurement of the test object.

In the calibration described above, error factors up to each test object measurement position can be removed. However, errors between the test object measurement positions, that is, in the case of two ports, error factors between points on the two ports in contact with a test-object electrode, are not taken into consideration. Among these errors, the maximum error is stray capacitance between the signal conductors. If there is stray capacitance, a measurement of the test object yields a value including the stray capacitance, which thereby causes an error.

To solve the problem, the electrical characteristics are measured in a state (open state) where nothing is connected to the signal conductors, and the stray admittance is obtained from the measurement results. By mathematically removing the effects of the stray admittance from the results of measuring the test object, errors due to the stray capacitance can be eliminated, and the characteristic measurement can be performed with higher accuracy.

To short the signal conductors and the ground conductor of the transmission line, the short standard is connected to the transmission line. However, due to high frequencies, the influence of the residual inductance of the short standard may be great, and the signal conductors and the ground conductor may not be sufficiently shorted (signal passes from one port to the other and the total reflection cannot be achieved).

In this case, it is preferable that the calibration standard be brought near (but not in contact with) the transmission line, and the stray capacitance generated between the transmission line and the calibration standard and the residual inductance of the calibration standard will form a series resonance state.

In the series resonance state, the impedance of a portion connected to the calibration standard is $0\Omega$, that is, an ideal short-circuited state is achieved. In other words, even at high frequencies where a satisfactory short standard is not realized, the same advantage as that of using a satisfactory short standard can be achieved.

In the case where a capacitor with a very small capacitance is used as the calibration standard, the capacitor may be brought into contact (completely connected) with the transmission line to produce series resonance.

It is preferable to use, as the transmission line of the present examples, a transmission line including signal conductors and a ground conductor disposed on the same plane. In this way, when performing calibration using a calibration standard or measurement using a test object, the calibration standard or the test object can be easily connected to the signal conductors and the ground conductor at the same time. Since the calibration standard or the test object can be vertically pressed against the transmission line at the time of calibration or measurement, a sufficient pressing load can be easily ensured, and hence the contact easily becomes stable.

Specifically, a coplanar waveguide or a slot line may be used as the transmission line. The coplanar waveguide includes signal conductors and ground conductors having the signal conductors therebetween, and the signal conductors and the ground conductors are disposed on the same plane. The coplanar waveguide is suitable for the measurement of high-frequency characteristics up to 10 GHz.

In contrast, the slot line includes signal conductors and a ground conductor, which are disposed on the same plane with a space therebetween. The slot line is suitable for the measurement of high-frequency characteristics at 10 GHz or higher.

It is preferable that the calibration standard be connected to positions at which the phase difference between the positions is between 70° and 145°.

In order to perform highly accurate calibration, it is preferable that pieces of calibration data be apart from each other as far as possible. In RRRR calibration where different pieces of calibration data are obtained depending on the reflection phase based on the calibration standard, preferably, for the sake of calibration, the phase difference between the positions at which the calibration standard is connected is between 70° and 145° in order to enhance the calibration accuracy. When the phase difference between the connection positions is set as described above, the frequency range that can be handled by a pair of calibration standards becomes quite narrow, though the calibration accuracy becomes high. However, when the setting of the positions at which the calibration standard is connected is very easy, and when the measured data in the calibration is put to full use, the number of times the calibration standard is measured is not greatly increased, even in the case of broadband measurement, which thereby presents no practical problem.

Other features and advantages of the present invention will become apparent from the following description of embodiments of the invention which refers to the accompanying drawings.

DETAILED DESCRIPTION OF EMBODIMENTS OF THE INVENTION

Hereinafter, RRRR calibration according to the present invention will be illustrated with reference to embodiments.

Embodiment 1

FIGS. 5 to 9 show a first embodiment according to the present invention.

—Calibration Standard in RRRR Calibration—

In RRRR calibration, a calibration standard to be measured is a short standard 10 in all cases, and a measuring fixture 11 (transmission line 12) to be used is the same fixture in all cases.

Figure 5:
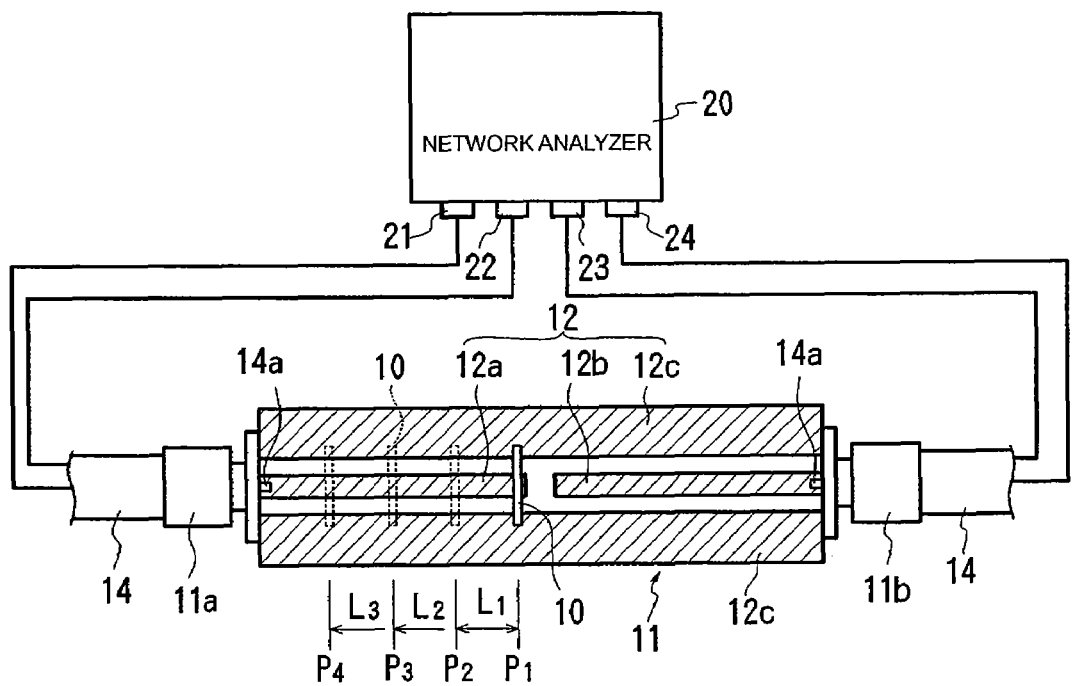
FIG. 5 is a plan view of a high-frequency electrical characteristic measuring apparatus showing an example of RRRR calibration according to an embodiment of the present invention.

As shown in FIG. 5, measurements are performed at three or more points on the transmission line 12 disposed on the measuring fixture 11. In this example, calibration performed on the side of a port 1 (connector 11a) will be described. However, the same operation is also done on the side of a port 2 (connector 11b).

Figure 6:
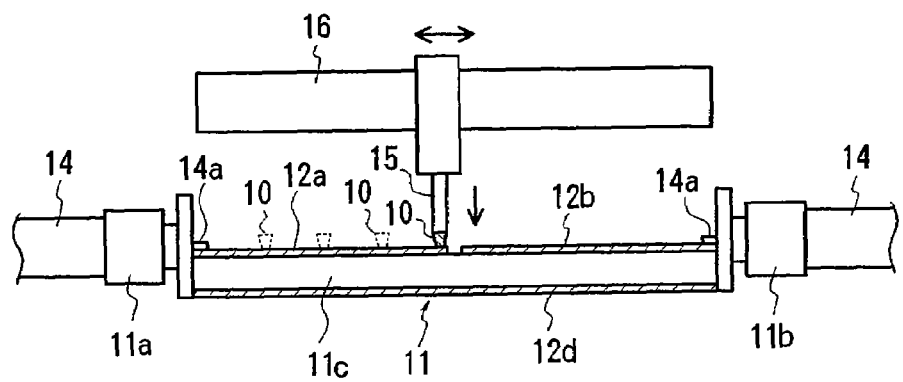
FIG. 6 is a front view of the high-frequency electrical characteristic measuring apparatus in the calibration example shown in FIG. 5.

Here, a description is given using a coplanar waveguide serving as the measuring fixture 11 as an example. The measuring fixture 11 includes, as shown in FIGS. 5 and 6, two signal conductors 12a and 12b disposed on a straight line on the top surface of a fixture board 11c. There is a space between first ends of the two signal conductors 12a and 12b, and second ends of the two signal conductors 12a and 12b are connected to the connectors 11a and 11b, respectively Ground conductors 12c have the signal conductors 12a and 12b therebetween in the width direction, with a space therebetween, and the signal conductors 12a and 12b and the ground conductors 12c are disposed on the same plane on the fixture board 11c. A ground conductor 12d is disposed on the back surface of the fixture board 11a. The connectors 11a and 11b are connected to coaxial cables 14 and to measurement ports 21 to 24 of a network analyzer 20, which is an example of a measuring device. Signal lines 14a of the coaxial cables 14 are fixed by soldering, welding, or the like to the signal conductors 12a and 12b in order to eliminate connection variations. The measurement ports 21 and 24 are connected via the coaxial cables 14 to the signal conductors 12a and 12b, and the measurement ports 22 and 23 are connected to the ground conductors 12b.

As shown in FIG. 6, a pusher 15 for pressing the short standard 10 against the transmission line 12 and a mechanism 16 for allowing the pusher 15 to freely move along the transmission line 12 are provided above the measuring fixture 11. A knife-edge-shaped conductor fixed to the tip of the insulating pusher 15 is used as the short standard 10.

—Connection and Measurement of Short Standard—

The short standard 10 is connected to a point at which a first electrode is connected to measure a test object (measurement point 1 in FIG. 5: P1, hereinafter referred to as a "test object measurement point"), and thereafter a measurement is made, where $S_{11M1}$ is the measurement result. Let $\Gamma_{A1}$ be a true value of a reflection parameter at the measurement point. $\Gamma_{A1}$ is a true value of the short standard. When the size of the short standard 10 in the longitudinal direction of the transmission line 12 is sufficiently smaller than the wavelength of a measured signal, $\Gamma_{A1}$ is set to −1. Otherwise, an estimated value of the true value is obtained by a simulation or the like.

Next, the short standard 10 is connected to a position on the signal conductor 12a distant from the test object measurement point by $L_1$ toward the port 1 (measurement point 2: P2), and thereafter a measurement is made, where $S_{11M2}$ is the measurement result. In this case, $\Gamma_{A2}$ is the true value of the reflection parameter of the short standard 10 at the measurement point 2. Let the test object measurement point be a reference plane, and the true value of the reflection parameter is expressed as shown in equation 1. Because an electromagnetic wave entering the port 1 is completely reflected by the short standard 10, the distance of the wave transmitted through the transmission line is shorter by 2 $L_1$ in a round trip than that in the case where the short standard 10 is connected to the test object measurement point. Here, $\alpha$ is the transmission degree [U/mm] of the transmission line per unit length, $\beta$ is a phase constant [rad/mm] of the transmission line, and $\Gamma_{A2}$ is the true value of the short standard 10 connected to the measurement point 2 with respect to the test object measurement point serving as the reference plane:

$$\Gamma_{A2}=\Gamma_{A1}\alpha^{-2L_1}\exp(j2\beta L_1) \quad [Eq. 1]$$

Next, the short standard 10 is connected to a position on the signal conductor 12a distant from the test object measurement point by $L_2$ toward the port 1 (measurement point 3: P3), and thereafter a measurement is made, where $S_{11M3}$ is the measurement result. As in the case of the measurement point 2, let the test object measurement point be the reference plane, and the true value of the reflection parameter is expressed as equation 2:

$$\Gamma_{A3}=\Gamma_{A1}\alpha^{-2L_2}\exp(j2\beta L_2) \quad [Eq. 2]$$

In equations 1 and 2, as is clear from the fact that the transmission degree of the transmission line is expressed in terms of negative power, $\Gamma_{A2}$ and $\Gamma_{A3}$ may exceed one. Normally, there is no short standard whose reflection parameter exceeds one. However, the above state is generated since the test object measurement point serves as the reference plane in equations 1 and 2, and this is not abnormal.

When the transmission line characteristics $\alpha$ and $\beta$ are unknown, a further (fourth) measurement is made by connecting the short standard 10 to a position on the transmission line distant from the measurement point 1 by $L_3$ toward the port 1 (measurement point 4: P4), where $S_{11M4}$ is the measurement result. As in the case of the measurement point 2, let the measurement point 1 be the reference plane, the true value $\Gamma_{A4}$ of the reflection parameter at the measurement point 4 is expressed as equation 3:

$$\Gamma_{A4}=\Gamma_{A1}\alpha^{-2L_3}\exp(j2\beta L_3) \quad [Eq. 3]$$

Here, as in the following equation, let $\xi$ be an equation including $\alpha$ and $\beta$, where $\xi$ physically represents a transmission parameter of the transmission line per unit length:

$$\xi=\alpha^{-2}\exp(j2\beta) \quad [Eq. 4]$$

Using equation 4, equations 1 to 3 can be rewritten as equations 5 to 7, respectively:

$$\Gamma_{A2}=\Gamma_{A1}\xi^{L_1} \quad [Eq. 5]$$

$$\Gamma_{A3}=\Gamma_{A1}\xi^{L_2} \quad [Eq. 6]$$

$$\Gamma_{A4}=\Gamma_{A1}\xi^{L_3} \quad [Eq. 7]$$

As has been described above, when the transmission line characteristics $\xi$ are unknown, not only error parameters, but also the transmission line characteristics $\xi$ can be obtained by shorting the transmission line at four points using the short standard.

The transmission line characteristics $\xi$ include two unknown values, namely, the transmission degree $\alpha$ and the phase parameter $\beta$. Since the transmission line characteristics $\xi$ are represented by a complex number in which a real number portion corresponds to the transmission degree $\alpha$ and an imaginary number portion corresponds to the phase parameter $\beta$, the transmission line characteristics $\xi$ can be obtained as one unknown value.

For the sake of the subsequent calculations, it is preferable that the distances $L_1$, $L_2$, and $L_3$ from the test object measuring position for measuring the short standard satisfy one of the following relationships:

$L_1:L_2:L_3=1:2:3$ $L_1:L_2:L_3=1:2:4$

When the distances $L_1$, $L_2$, and $L_3$ satisfy one of the above relationships, the transmission line characteristics can be explicitly calculated using the following equation. When the distances $L_1$, $L_2$, and $L_3$ do not satisfy either of the above relationships, the transmission line characteristics cannot be calculated using the following equation, and it is thus necessary to obtain the transmission line characteristics by iterative calculations or the like.

When the positions $L_1$, $L_2$, and $L_3$ for measuring the short standard satisfy the relationship $L_1:L_2:L_3=1:2:3$, $\xi$ can be obtained using equation 8:

$$\xi=[[\{(S_{11M3}^2+(2S_{11M1}-4S_{11M2})S_{11M3}+4S_{11M1}S_{11M2}-3S_{11M1}^2)S_{11M4}^2$$

$$+((2S_{11M2}-4S_{11M1})S_{11M3}^2+(4S_{11M2}^2-4S_{11M1}S_{11M2}+4S_{11M1}^2)S_{11M3}$$

$$-4S_{11M1}S_{11M2}^2+2S_{11M1}^2S_{11M2})S_{11M4}+(4S_{11M1}S_{11M2}-3S_{11M2}^2)S_{11M3}^2$$

$$+(2S_{11M1}S_{11M2}^2-4S_{11M1}^2S_{11M2})S_{11M3}+S_{11M1}^2S_{11M2}^2\}^{1/2}$$

$$+(S_{11M3}-2S_{11M2}+S_{11M1})S_{11M4}+(S_{11M2}-2S_{11M1})S_{11M3}+S_{11M1}S_{11M2}]$$

$$/((2S_{11M2}-2S_{11M1})S_{11M4}+(2S_{11M1}-2S_{11M2})S_{11M3})]^{1/L1} \quad [Eq. 8]$$

In contrast, when the positions $L_1$, $L_2$, and $L_3$ satisfy the relationship $L_1:L_2:L_3=1:2:4$, $\xi$ can be obtained using equation 9:

$$\xi=[[\{(S_{11M3}^2-2S_{11M2}S_{11M3}-3S_{11M2}^2+8S_{11M1}S_{11M2}-4S_{11M1}^2)S_{11M4}^2$$

$$+(-2S_{11M1}S_{11M3}^2+(8S_{11M2}^2-12S_{11M1}S_{11M2}+8S_{11M1}^2)S_{11M3}$$

$$-2S_{11M1}S_{11M2}^2)S_{11M4}+(-4S_{11M2}^2+8S_{11M1}S_{11M2}-3S_{11M1}^2)S_{11M3}^2$$

$$-2S_{11M1}^2S_{11M2}S_{11M3}+S_{11M1}^2S_{11M2}^2\}^{1/2}+(S_{11M3}-S_{11M2})S_{11M4}$$

$$-S_{11M1}S_{11M3}+S_{11M1}S_{11M2}]$$

$$/\{(2S_{11M2}-2S_{11M1})S_{11M4}+(2S_{11M1}-2S_{11M3})S_{11M3}\}]^{1/L1} \quad [Eq. 9]$$

When the ratio of $L_1:L_2:L_3$ does not satisfy either of the above conditions, an equation for obtaining $\xi$ is not explicitly derived herein. In such a case, a similar equation may be derived as needed, or $\xi$ may be obtained by iterative calculations.

When $\xi$ is obtained by equation 8 or 9, the values $\Gamma_{A2}$ and $\Gamma_{A3}$ can be calculated by equations 5 and 6. Thus, the error parameters can be successively obtained, which will be described subsequently.

—Connection and Measurement of Through Chip—

Figure 7:
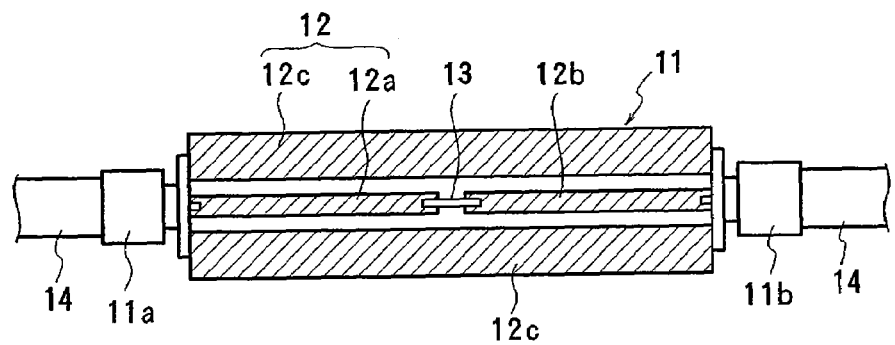
FIG. 7 is a plan view of the high-frequency electrical characteristic measuring apparatus in a through measurement according to the example.

Next, a measurement is made in a through state (ports are directly connected to each other), as shown in FIG. 7. A device appropriate for establishing a connection between the ports (hereinafter referred to as a through chip) 13 is connected in series between the signal conductors 12a and 12b. Measured values are such that $S_{11MT}$ and $S_{22MT}$ are reflection parameters, and $S_{21MT}$ and $S_{12MT}$ are transmission parameters. As will be described subsequently, the electrical characteristics of the through chip 13 need not be known. For example, a chip resistor whose resistance is unknown may serve as the through chip 13. However, the transmission parameters of the through chip 13 shall not have directivity. Since the transmission parameters do not have directivity on the basis of the reciprocity theorem, unless a special material, such as a ferrite under the DC magnetic field, is used, this condition is usually automatically satisfied.

—Calculation of Error Coefficients of Error Model of RRRR Calibration—

Figure 1:
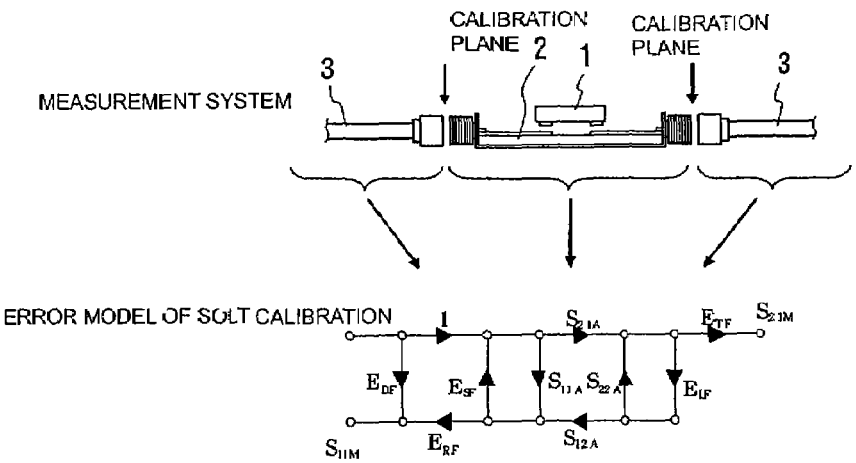
FIG. 1 is a diagram showing a measurement system using a network analyzer and an error model of SOLT calibration.
Figure 2:
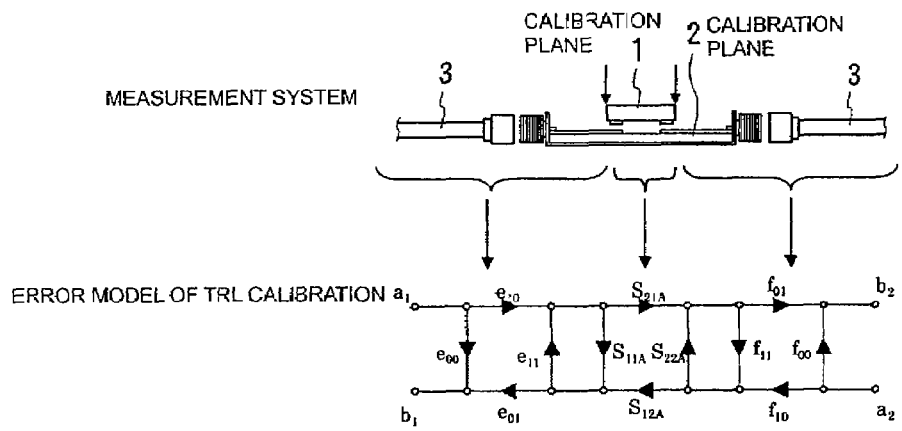
FIG. 2 is a diagram showing a measurement system using a network analyzer and an error model of TRL calibration.
Figure 3:
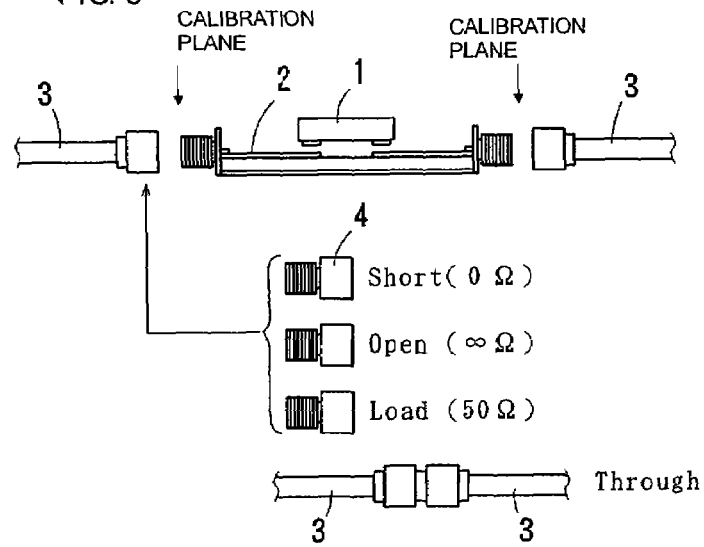
FIG. 3 is a diagram showing SOLT calibration.
Figure 4:
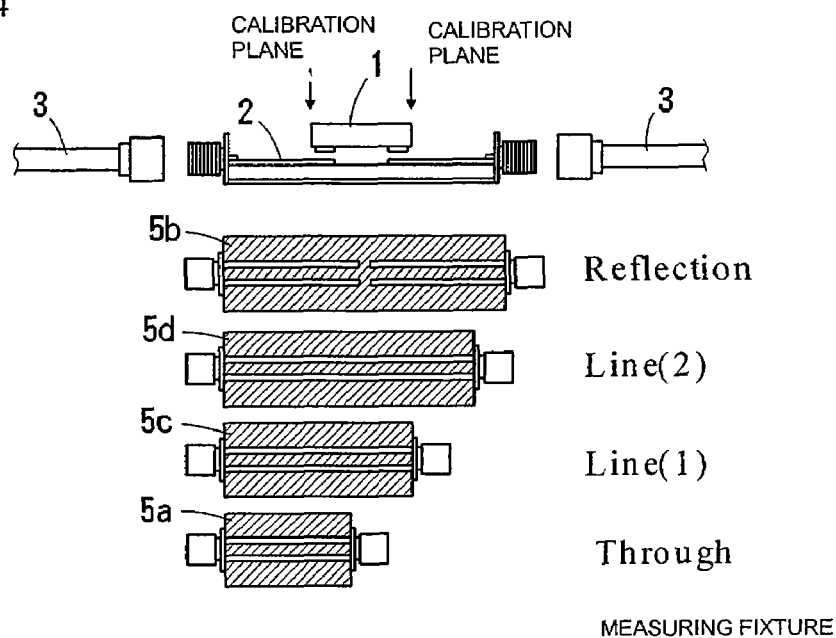
FIG. 4 is a diagram showing TRL calibration.
Figure 8:
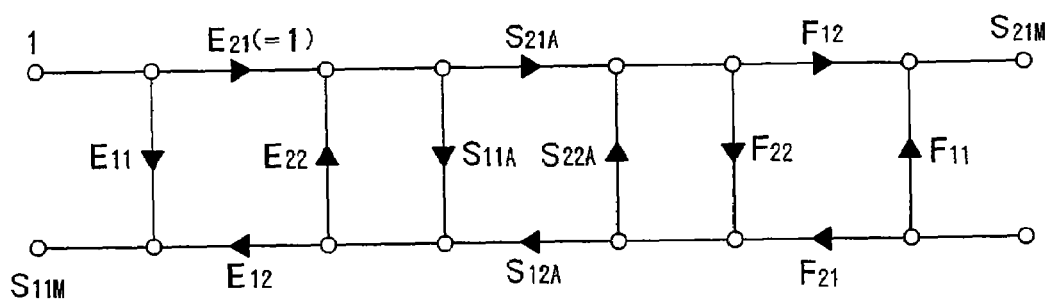
FIG. 8 is a diagram of an error model for use in the RRRR calibration according to the example.
Figure 9:
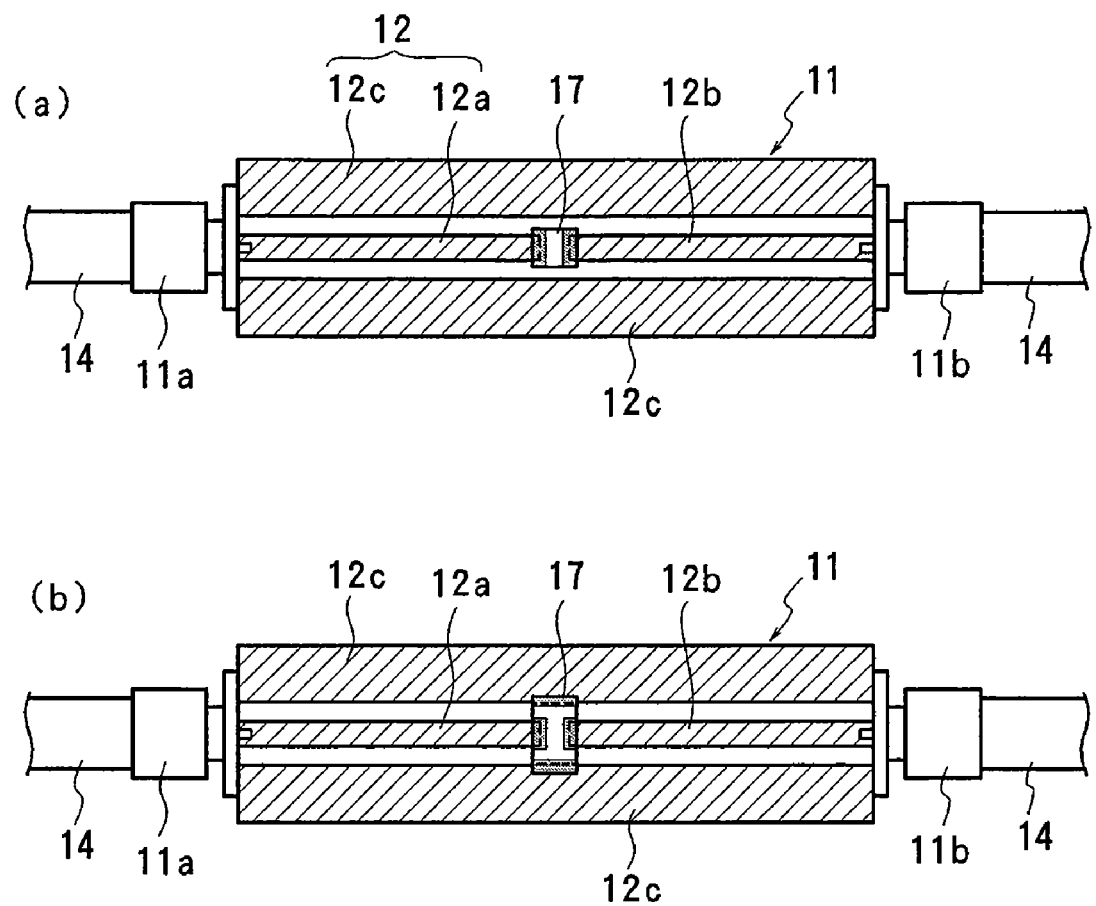
FIG. 9 includes plan views of the high-frequency electrical characteristic measuring apparatus according to the example, which is measuring a test object.

FIG. 8 shows an error model of RRRR calibration. This is the same as an error model that has been used in TRL calibration (FIG. 2). In the diagram, $S_{11M}$ and $S_{21M}$ are estimated values of a reflection parameter and a transmission parameter, respectively, and $S_{11A}$, $S_{21A}$, $S_{12A}$ and $S_{22A}$ are true values of scattering parameters of a test object. There are eight error coefficients $E_{XX}$ and $F_{XX}$. Since the scattering parameter measurement is the ratio measurement, seven error factors are sufficient to be defined. Specifically, let $E_{21}=1$.

On the basis of the measurement results obtained by connecting the short standard 10 in the above described manner, the error coefficients in FIG. 8 are obtained. First, $E_{11}$, $E_{12}$, $E_{22}$, $F_{11}$, $(F_{21} \cdot F_{12})$, and $F_{22}$ are calculated using the following equations. Since $F_{XX}$ is the same as $E_{XX}$, only $E_{XX}$ is described. At this stage, the product $(F_{21} \cdot F_{12})$ of the error coefficients $F_{21}$ and $F_{12}$ can be obtained, although the error coefficients $F_{21}$ and $F_{12}$ cannot be obtained individually, where $D_1$ is an intermediate variable:

$$D_1 = \Gamma_{A2}\Gamma_{A3}S_{11M3} - \Gamma_{A1}\Gamma_{A3}S_{11M3} - \Gamma_{A2}\Gamma_{A3}S_{11M2} + \quad [\text{Eq. 10}]$$
$$\Gamma_{A1}\Gamma_{A2}S_{11M2} + \Gamma_{A1}\Gamma_{A3}S_{11M1} - \Gamma_{A1}\Gamma_{A2}S_{11M1}$$

$$E_{11} = -(\Gamma_{A1}\Gamma_{A3}S_{11M2}S_{11M3} - \Gamma_{A1}\Gamma_{A2}S_{11M2}S_{11M3} -$$
$$\Gamma_{A2}\Gamma_{A3}S_{11M1}S_{11M3} + \Gamma_{A1}\Gamma_{A2}S_{11M1}S_{11M3} +$$
$$\Gamma_{A2}\Gamma_{A3}S_{11M1}S_{11M2} - \Gamma_{A1}\Gamma_{A3}S_{11M1}S_{11M2})/D_1$$

$$E_{21}E_{12} = \frac{(\Gamma_{A2}-\Gamma_{A1})(\Gamma_{A2}-\Gamma_{A1})(\Gamma_{A2}-\Gamma_{A1})}{D_1^2}$$
$$\cdot (S_{11M2}-S_{11M1})(S_{11M3}-S_{11M1})(S_{11M3}-S_{11M2})$$

$$E_{22} = \frac{\Gamma_{A2}S_{11M3} - \Gamma_{A1}S_{11M3} - \Gamma_{A2}S_{11M3} +}{D_1}$$
$$\frac{\Gamma_{A3}S_{11M2} + \Gamma_{A3}S_{11M1} - \Gamma_{A2}S_{11M1}}{D_1}$$

Next, the measurement results $S_{21MT}$ and $S_{12MT}$ of the transmission parameters of the through chip in the forward and reverse directions are expressed as the following equations using the error factors in FIG. 8. For a moment, let $S_{11A}$, $S_{21A}$, $S_{12A}$, and $S_{22A}$ be true values of the scattering parameters of the through chip:

$$S_{21MT} = \frac{E_{21}S_{21A}F_{12}}{E_{22}F_{22}S_{11A}S_{22A} - E_{22}F_{22}S_{21A}S_{12A} - F_{22}S_{22A} - E_{22}S_{11A} + 1} \quad [\text{Eq. 11}]$$

$$S_{12MT} = \frac{F_{21}S_{12A}E_{12}}{E_{22}F_{22}S_{11A}S_{22A} - E_{22}F_{22}S_{11A}S_{22A} - F_{22}S_{22A} - E_{22}S_{11A} + 1}$$

The ratio between $S_{21MT}$ and $S_{12MT}$ is discussed. Equations 11 are simplified into the following equation by paying attention to the fact that the transmission parameters of the through chip in the forward and reverse directions are equivalent ($S_{21A}=S_{12A}$). It should be noted that all the scattering parameters $S_{11A}$, $S_{21A}$, $S_{12A}$, and $S_{22A}$ of the through chip vanish by division. That is, even when the true values of the scattering parameters of the through chip are unknown, if the through chip has no directivity, the relationship among the error coefficients is determined by the ratio between $S_{21MT}$ and $S_{12MT}$ (which are measurable values).

$$\frac{S_{21MT}}{S_{12MT}} = \frac{E_{21}F_{12}}{F_{21}E_{12}} \quad [\text{Eq. 12}]$$

All the error coefficients can be determined on the basis of equations 10 and 12:

$$E_{21}=1$$
$$E_{12}=(E_{21}E_{12})/E_{21}$$
$$F_{12}=\sqrt{(E_{21}E_{12})(F_{21}F_{12})S_{12MT}/S_{21MT}}$$
$$F_{21}=(F_{21}F_{12})/F_{12} \quad [\text{Eq. 13}]$$

All the error coefficients are determined in the above-described manner. The above discussion is based on the case where a signal is applied from the port 1 to the port 2 (forward direction). In the case of the reverse direction, the error coefficients can be derived by setting $F_{21}=1$ instead of $E_{21}=1$.

—Measurement of Test Object and RRRR Calibration—

After the error coefficients are obtained, a test object 17 is connected to the transmission line 12, and characteristics of the test object 17 are measured. For example, the test object 17 is picked up using a chip mounter or the like to bring the test object 17 into contact with the test object measuring position on the transmission line 12, and the electrical characteristics ($S_{11M}$, $S_{21M}$, $S_{12M}$, and $S_{22M}$) are measured. When the test object 17 has two terminals, as shown in portion (a) of FIG. 9, the test object 17 is connected in series between the signal conductors 12a and 12b. When the test object 17 has three terminals or four terminals, as shown in portion (b) of FIG. 9, the test object 17 is connected among the signal conductors 12a and 12b and the ground conductors 12c. Thus, the measurement method according to the present invention is applicable not only to a two-terminal electronic device but also to an electronic device, such as a filter, with three or more terminals.

Since the error model of RRRR calibration is the same as that of TRL calibration, the effects of errors can be removed from the actual results of measuring the test object by performing calculations similar to those in TRL calibration. Equations for removing the effects of errors are given below. In order to remove the effects of error factors, these equations are calculations based on the reflection parameters in the case of two-port measurement. Alternatively, calculations may be based on the outputs of four ports of the network analyzer. In the case of three or more ports, equations similar to these equations may be used, or the effects of error factors may be removed with a circuit simulation technique. In short, any known technique may be selected. In equations 14, $D_2$ is an intermediate variable.

$$D_2 = \left\{\frac{E_{22}(S_{11M} - E_{11})}{E_{12}} + 1\right\}\left\{\frac{F_{22}(S_{22M} - F_{11})}{F_{12}} + 1\right\} - \frac{F_{22}F_{11}S_{12M}S_{21M}}{F_{12}E_{12}}$$ [Eq. 14]

$$S_{11A} = \frac{(S_{11M} - E_{11})\{F_{22}(S_{22M} - F_{11})/F_{12} + 1\}/E_{12} - F_{22}S_{12M}S_{21M}/(F_{12}E_{12})}{D_2}$$

$$S_{21A} = \frac{S_{21M}/F_{12}\{(F_{22} - F_{22})(S_{22M} - F_{11})/F_{12} + 1\}}{D_2}$$

Figure 10:
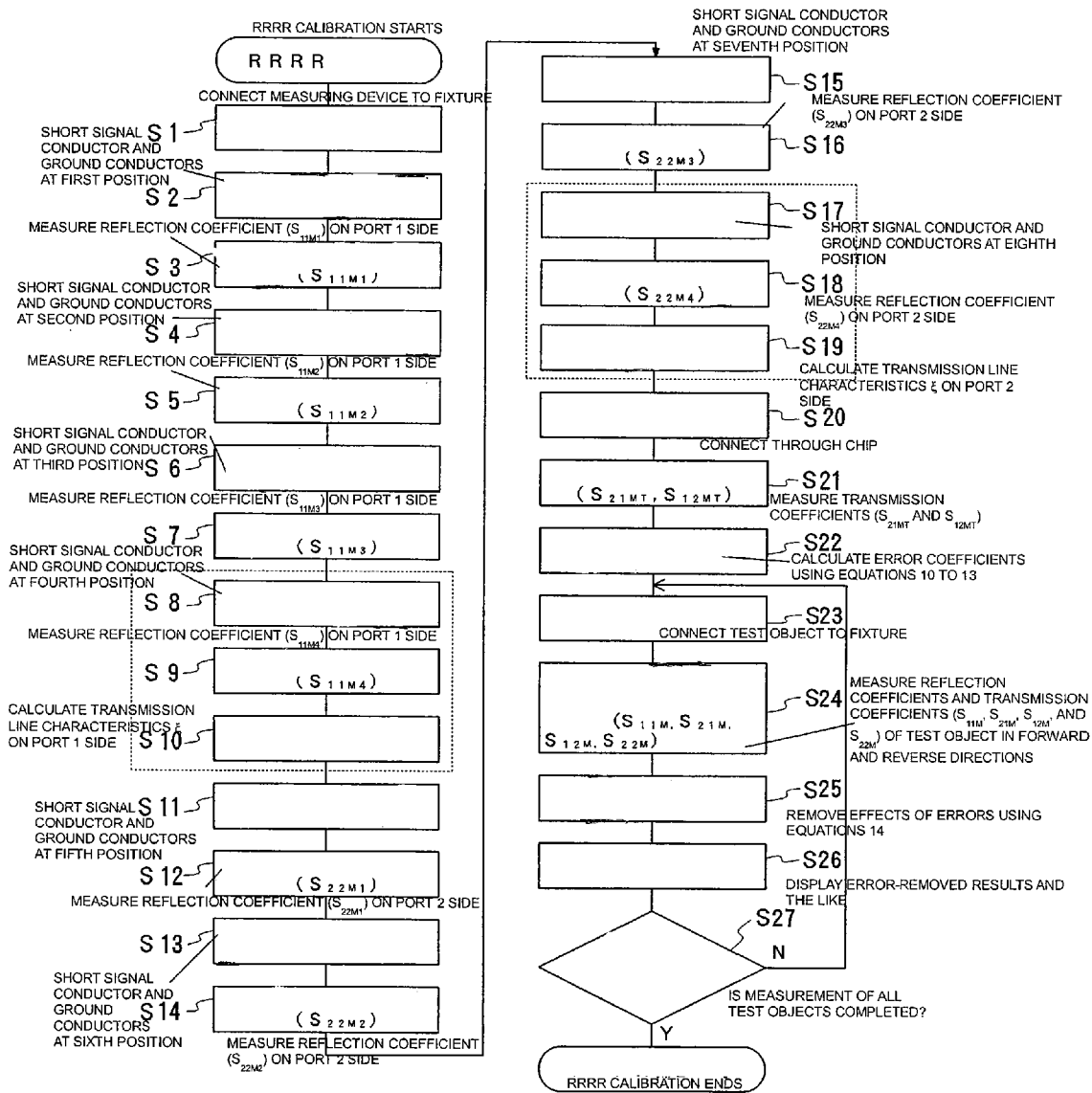
FIG. 10 is a flowchart of an example of the RRRR calibration according to the example.

FIG. 10 is a flowchart of an example of an RRRR calibration method.

When calibration starts, a measuring device is connected via coaxial cables to a measuring fixture (step S1). Next, the signal conductor 12a and the ground conductors 12c are shorted by the short standard 10 at a first position, which is the open end of the signal conductor 12a (step S2). The first position may be in the vicinity of the test object measurement position or another position. While the short standard 10 is being connected, the reflection parameter ($S_{11M1}$) on the port 1 side is measured (step S3).

Next, the signal conductor 12a and the ground conductors 12c are shorted by the short standard 10 at a second position (step S4), and the reflection parameter ($S_{11M2}$) on the port 1 side is measured (step S5). Next, the signal conductor 12a and the ground conductors 12c are shorted by the short standard 10 at a third position (step S6), and the reflection parameter ($S_{11M3}$) on the port 1 side is measured (step S7). If the transmission line characteristics are unknown, the signal conductor 12a and the ground conductors 12c are again shorted by the short standard 10 at a fourth position (step S8), and the reflection parameter ($S_{11M4}$) on the port 1 side is measured (step S9). On the basis of the reflection parameters, the transmission line characteristics $\xi$ on the port 1 side are calculated (step S10). When the transmission line characteristics $\xi$ are known, steps S8 to S10 are unnecessary.

Next, the other signal conductor 12b and the ground conductors 12c are shorted by the short standard 10 at a fifth position, which is the open end of the signal conductor 12b (step S11). The fifth position may be in the vicinity of the test object measurement position or another position. While the short standard 10 is connected, the reflection parameter ($S_{22M1}$) on the port 2 side is measured (step S12).

Next, the signal conductor 12b and the ground conductors 12c are shorted by the short standard 10 at a sixth position (step S13), and the reflection parameter ($S_{22M2}$) on the port 2 side is measured (step S14). Next, the signal conductor 12b and the ground conductors 12c are shorted by the short standard 10 at a seventh position (step S115), and the reflection parameter ($S_{22M3}$) on the port 2 side is measured (step S16). If the transmission line characteristics are unknown, the signal conductor 12b and the ground conductors 12c are again shorted by the short standard 10 at an eighth position (step S17), and the reflection parameter ($S_{22M4}$) on the port 2 side is measured (step S18). On the basis of the reflection parameters, the transmission line characteristics $\xi$ on the port 2 side are calculated (step S119). When the transmission line characteristics $\xi$ are known, steps S17 to S19 are unnecessary.

Next, the through chip 13 is connected in series between the signal conductors 12a and 12b (step S20), and the transmission parameters ($S_{21MT}$ and $S_{12MT}$) are measured (step S21).

Thereafter, the error coefficients are calculated using the measured reflection parameters, transmission parameters, and transmission line characteristics $\xi$, using equations 10 to 13 (step S22).

After the error coefficients have been calculated, the test object is connected to the measuring fixture (step S23), and the reflection parameters and the transmission parameters ($S_{11M}$, $S_{21M}$, $S_{12M}$, and $S_{22M}$) of the test object in the forward and reverse directions are measured (step S24). Next, the effects of errors are removed from the measured values using equations 14 (step S25), and the error-removed results (true values of the test object) are displayed on a display and the test object is selected (step S26). Thereafter, steps S23 to S26 are repeated until the measurement of all the test objects is completed (step S27). When the measurement of all the test objects has been completed, the RRRR calibration ends.

When there is poor contact between the short standard 10 and the transmission line 12 upon connection of the short standard 10, a wrong reflection parameter is measured. When a measurement is made without knowing that there is poor contact, there may be a waste of time, such as a calibration failure recognized subsequently upon the measurement of the test object.

Figure 11:
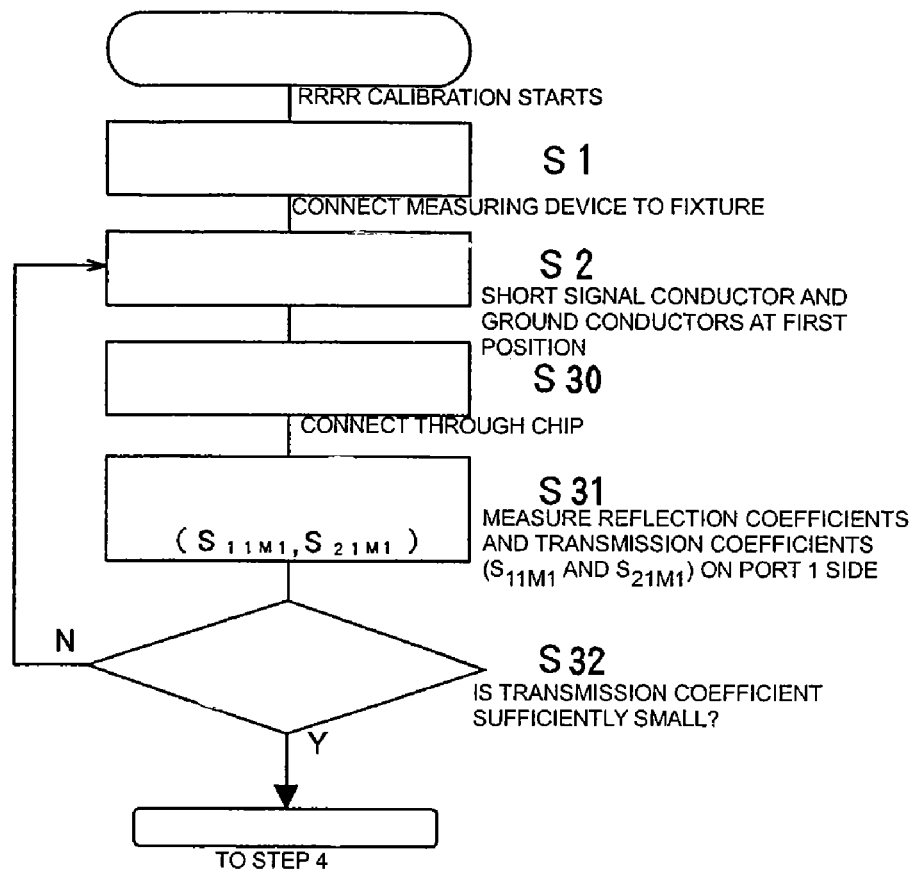
FIG. 11 is a flowchart of another example of the RRRR calibration according to the present invention.

FIG. 11 is a flowchart of an additional step of detecting poor contact on the basis of the transmission parameter, in the process of deriving the error coefficients in FIG. 10. Although detection of poor contact only at the first position is shown here, similar processing is performed at the other positions.

First, the measuring device is connected via the coaxial cables to the measuring fixture (step S1). Next, the signal conductor 12a and the ground conductors 12c are shorted by the short standard 10 at the first position (step S2), and, simultaneously, the through chip 13 is connected between the signal conductors 12a and 12b (step S30). While the short standard 10 and the through chip 13 are connected at the same time, the reflection parameter ($S_{11M1}$) and the transmission parameter ($S_{21M1}$) on the port 1 side are measured (step S31). It is determined whether the measured transmission parameter is sufficiently small (step S32). If the transmission parameter is not sufficiently small, it is determined that there is poor contact, and the processing from step S2 onward is again repeated. In contrast, if the transmission parameter is sufficiently small, it is determined that the contact is satisfactory, and a measurement is made at the second position.

As has been described above, when the short standard 10 is in proper contact, total reflection occurs. Hence, the transmission parameter between the ports of the fixture is very small. However, when there is poor contact between the short standard 10 and the transmission line 12, the transmission parameter between the ports becomes large. Using a transmission parameter difference, poor contact can be easily detected.

Since a measurement error can be detected during the calibration procedure, it is possible to avoid a waste of time, such as a calibration failure recognized subsequently upon the measurement of the test object.

A description will now be given of the manner in which the positions at which the short standard 10 is measured are selected.

For example, it is assumed that the short standard 10 is measured at the test object measurement point on the transmission line 12 and at a point 5 mm away from the test object measurement point. If the transmission line 12 has low loss, the only difference between the measurement results at the two points is the phase. Let the wavelength be 30 mm (the wavelength of a 1-GHz electromagnetic wave in a vacuum), and a difference of 5 mm in position corresponds to a difference of 10 mm in position in a round trip. Thus, it is expected that the measured data has a phase difference of (10 mm÷30 mm)×360°=120°. However, let the wavelength be 10 mm (the wavelength of a 3-GHz electromagnetic wave in a vacuum), and the same difference of 10 mm in position in a round trip generates a phase difference of 10 mm÷10 mm×360°=360°, and hence there will be no phase difference. With a difference of 5 mm in position, calibration cannot be performed properly at the frequency of the 10-mm wavelength.

In order to perform highly accurate calibration, it is preferable that pieces of calibration data be spaced apart from each other as far as possible. In the RRRR calibration where different pieces of calibration data are obtained depending on the reflection phase based on the short standard, it is preferable to adopt the condition where the phase difference between the positions at which the short standard is connected is between 70° and 145°.

The greater the phase difference between the calibration standards, the higher the accuracy of calibration. However, the frequency range that can be handled by a pair of calibration standards becomes narrow, and it thus becomes necessary to measure many calibration standards in order to perform broadband measurement. In the case of TRL calibration using the phase difference between calibration standards to perform calibration, as in the RRRR calibration, it is necessary to have a phase difference of 20° to 30° or greater between calibration standards in order to achieve a satisfactory measurement accuracy.

In contrast, when the phase difference between the positions at which the short standard is connected is between 70° and 145°, although the calibration accuracy becomes high, the frequency range that can be handled by a pair of calibration standards becomes very narrow, compared with the above case. However, as will be described below, when the setting of the positions at which the short standard is connected is very easy, and when the measured data in the calibration is put to full use, the number of times the short standard is measured is not greatly increased, even in the case of broadband measurement, which thereby presents no practical problem.

First, the second position at which the short standard is measured, at which the phase at the upper limit measurement frequency is about 145°, is obtained. Specifically, the second position is obtained using the following equation:

$$L = \frac{145\pi}{180\beta} \quad \text{[Eq. 15]}$$

where $\beta$[rad/mm] is a phase constant, and L[mm] is a position at which the short standard is measured.

Next, the third position at which the short standard is measured is set to 2 L[mm], and the fourth position at which the short standard is measured is set to 4 L[mm]. Similarly, the n-th position at which the short standard is measured is set to $2^{n-2}$ L[mm].

In the frequency band from the upper limit measurement frequency $f_{max}$ to $f_{max}/2$, the RRRR calibration is performed using the results of measurements made at the first, second, and third positions at which the short standard is measured. In the frequency band from $f_{max}/2$ to $f_{max}/4$, the results of measurements made at the first, third, and fourth positions at which the short standard is measured are used. Similarly, in an n-th frequency band, namely, the frequency band from $f_{max}/2n-1$ to $f_{max}/2n$, the results of measurements made at the first, (n+1)-th, and (n+2)-th positions at which the short standard is measured are used. Accordingly, the phase difference between the positions at which the short standard is measured remains between 70° and 145°.

—Open Calibration—

Figure 12:
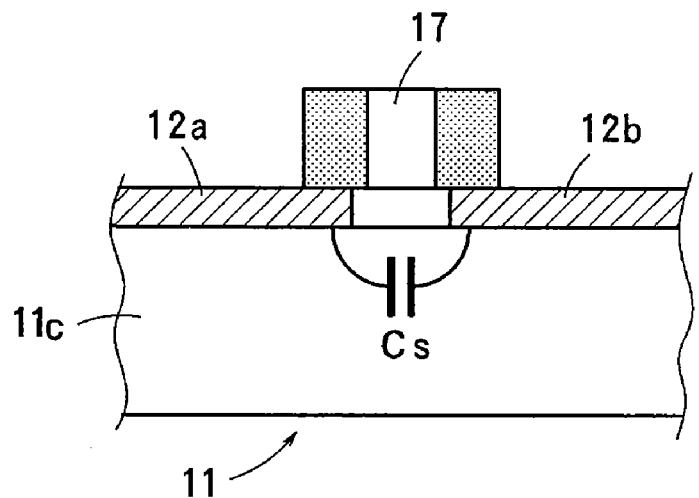
FIG. 12 is a view showing the effects of stray capacitance generated between transmission lines.

In the RRRR calibration, error factors up to each test object measurement position can be removed. However, errors between the test object measurement positions, that is, in the case of two ports, error factors between points on the two ports in contact with a test-object electrode, are not taken into consideration. Among these errors, the maximum error is stray capacitance between the ports (stray capacitance Cs between the signal conductors 12a and 12b), as shown in FIG. 12. That is, a signal that has been TEM-transmitted through the coplanar waveguide is blocked by the test object 17 with a high impedance and is thereby reflected. However, part of the signal is transmitted as a TM wave, which causes an error. A series method to which the RRRR method belongs is supposed to be able to perform high impedance measurement using a high-isolation measuring fixture. If a measuring fixture made of a high dielectric material, such as a glass epoxy material, or a thick measuring fixture of 1.6 mm or the like is used, the stray capacitance between the ports becomes higher, whereas the isolation becomes lower. This problem is alleviated by fabricating a thin measuring fixture made of a low dielectric material, such as Teflon®. However, when this alleviation is not sufficient, or when a measuring fixture with satisfactory characteristics cannot be used because the cost is too high (Teflon® boards are generally expensive), the error can be corrected mathematically.

In other words, the stray admittance of the measurement results is obtained on the basis of the results of measurement of the measuring fixture alone (open state), and the effects of the stray admittance are mathematically removed from the results of measuring the test object. Let $Z_C$ be the impedance of the RRRR-calibrated measuring fixture, and $Z_M$ be the impedance obtained by RRRR-calibrating the test object measurement results, then the mathematically-processed (open-calibrated) impedance $Z_L$ is obtained using the following equation. If $Z_C$ is excessively high, it may be possible that the dynamic range of the measurement system becomes narrow and the measurement results vary greatly. In order to avoid such a problem, a measuring fixture with a very low isolation is not used. Generally, the satisfactory results may be obtained with the processing described above.

$$Z_L = \frac{Z_C Z_M}{Z_C - Z_M} \quad \text{[Eq. 16]}$$

Whereas the description of the RRRR method has been given mainly in terms of the scattering parameters, the description of the open calibration has been given using the impedance. The impedance and the scattering parameters are interconvertible physical quantities. Let $Z_0$ be the characteristic impedance of the transmission line, and $S_{11}$ be the reflection parameter of the scattering parameters, and $S_{21}$ be the transmission parameter of the scattering parameters. The scattering parameters and the impedance Z can be converted using the following equations. Although two equations are given, basically the same results are obtained with either equation.

$$Z = -\frac{2Z_0 S_{11}}{S_{11} - 1}, \quad Z = -\frac{2Z_0(S_{21} - 1)}{S_{21}} \quad [\text{Eq. 17}]$$

—Measurement Results—

Figure 13:
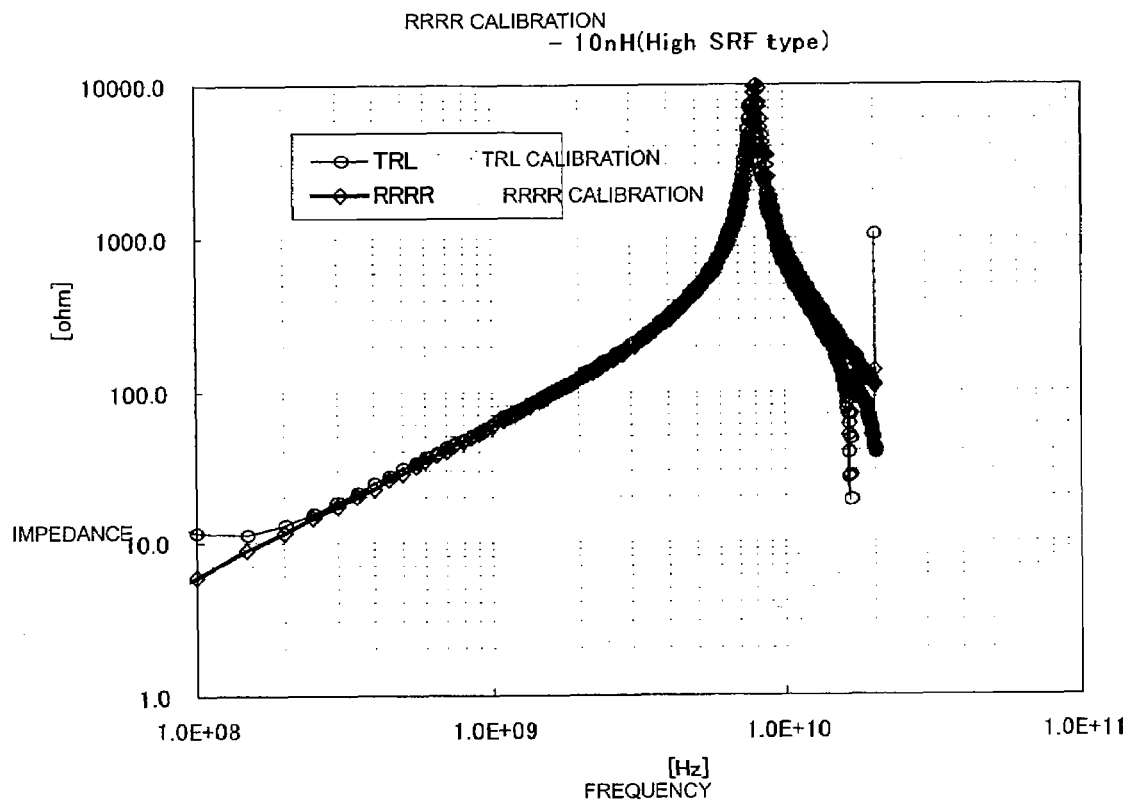
FIG. 13 is a diagram of high-frequency characteristics of a chip inductor measured using the RRRR calibration according to the embodiments of the present invention.

Using the RRRR calibration and the open calibration described above, a 10-nH chip inductor (wire-wound chip inductor) with a size of 1 mm×0.5 mm is measured within the range from 100 MHz to 20 GHz, the results of which are shown in FIG. 13.

As is clear from FIG. 13, a general impedance characteristic curve of an inductor is obtained. That is, the impedance increases in proportion to an increase in frequency up to the self-resonance frequency, and, after the self-resonance frequency, the impedance decreases in inverse proportion to an increase in frequency. These results substantially trace those obtained in the measurement performed with the known TRL calibration.

Accordingly, it is confirmed that the true values of the test object can be measured by the RRRR calibration.

Embodiment 2

Error Correction Method without Using Through Chip

In the first embodiment, the directivity-free through chip 13 is connected in series between the signal conductors 12a and 12b, the transmission parameters $S_{21MT}$ and $S_{12MT}$ in the forward and reverse directions are measured, and the ratio $S_{21MT}/S_{12MT}$ is obtained, thereby determining the relationship among the error coefficients. If a test object has no directivity, the through chip measurement may be omitted, and the error coefficients can be determined using the results of measuring the test object.

For example, most test objects including a filter, a coupler, a balun, a capacitor, a resistor, and a coil have no directivity. Thus, these test objects may also be regarded as types of through chips. The transmission parameter ratio $S_{21M}/S_{12M}$ is obtained on the basis of the results of measuring the test object. This ratio replaces $S_{21MT}/S_{12MT}$, and hence the relationship among the error coefficients can be determined using equation 12.

Embodiment 3

Calibration Method Using Calibration Standard Other than Short Standard

In the RRRR calibration, when a calibration standard 18 with transmission parameters similar to those of a chip resistor is used instead of the short standard 10, part of a signal entering one port passes through a portion in contact with the calibration standard, and the partial signal is completely reflected at the open end of the signal conductor and returns, which may cause a measurement error.

Figure 14:
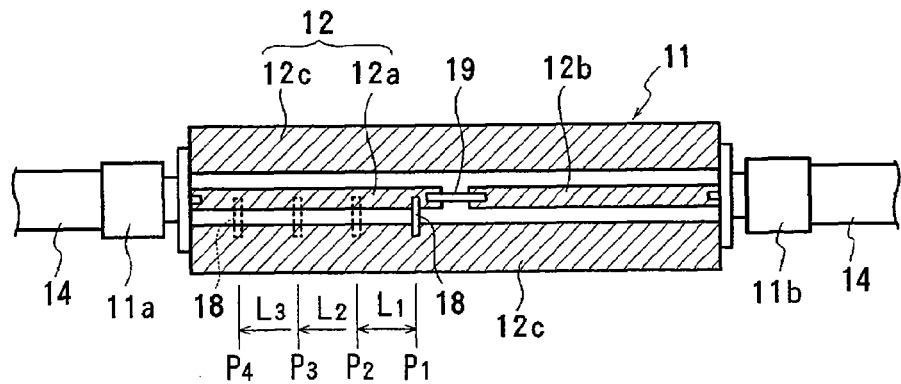
FIG. 14 is a plan view of the high-frequency electrical characteristic measuring apparatus showing another example of the RRRR calibration according to the present invention.

In this case, as shown in FIG. 14, the open end of the signal conductor 12a and the open end of the signal conductor 12b are connected to each other via a through chip 19, and, in this state, the calibration standard 18 is connected to at least three points on the transmission line 12 to perform RRRR calibration. The through chip 19 may be a device similar to the through chip 13 in the through measurement (see FIG. 7) or a short chip such as the short standard 10.

Even when part of the signal passes through the contact portion between the calibration standard 18 and the signal conductor 12a, the signal is transmitted through the through chip 19 toward the port 2 and is absorbed on the port 2 side, thereby reducing the level of the signal returning to the port 1. For example, the generally estimated reflection level at the port 2 is between −15 dB and −25 dB. Let the average level be −20 dB. Even when 50% (−6 dB) of the input signal passes through the portion in contact with the calibration standard and reaches the port 2, the level is about −32 dB (=−6−20−6) in a round trip, and the error level is about 2.5% of the input signal.

Therefore, high calibration accuracy can be ensured even when the calibration standard 18 with the transmission parameters is used.

Embodiment 4

With the RRRR calibration alone, errors of the entire measurement system can be corrected. In contrast, when the RRRR calibration is performed after the coaxial connectors connected to the measuring fixture are calibrated using the SOLT calibration or the like, the obtained error coefficients are error coefficients of the fixture board. That is, the RRRR calibration can be used as a method for identifying the error factors of the fixture.

Recent network analyzers are equipped with a function (de-embedding function) for automatically removing the effects of given errors from the measurement results when the error coefficients of the fixture or the like are given. Since there is no method to obtain errors of the fixture, this function is not actually often used. However, when this function is combined with the RRRR calibration according to the present invention, this function becomes a very convenient function.

De-embedding is a technique for mathematically removing known error factors and is easily implemented using a transfer matrix. A scattering parameter matrix of the obtained error factors of the fixture are converted into a transfer matrix, and an inverse matrix of the transfer matrix is calculated. Let $E^{-1}$ and $F^{-1}$ be inverse matrices of the transfer matrices on the sides of the ports 1 and 2, respectively. A transfer matrix of the error factors at each port of the fixture is EF. Let A be a transfer matrix of the device. The results of measuring the device including the fixture using the network analyzer calibrated up to the tips of the coaxial cables include errors at each port superimposed onto the characteristics of the device, and hence $$E \cdot A \cdot F$$

is supposed to be measured. This is multiplied by $E^{-1}$ and $F^{-1}$ from the left and right hand sides:

$$E^{-1} \cdot E \cdot A \cdot F \cdot F^{-1} = A$$

Thus, the characteristics of the device are obtained.

With the de-embedding technique, the RRRR calibration procedure requiring the highly accurate positioning of the calibration standard or the like is performed in a laboratory environment to determine error factors of each fixture with high accuracy. In a mass production step, devices can be mass-produced using a fixture whose error factors are already known. Needless to say, the errors of the fixture are removed by de-embedding the error factors obtained in the laboratory.

Accordingly, the RRRR method can be exercised without preparing means for positioning the calibration standard with high accuracy in each process. This is advantageous in terms of cost and production control.

Embodiment 5

The measuring device is equipped with a computer and dedicated software. When the residual inductance of the calibration standard, parameters (phase constant β[rad/mm] and transmission loss δ[dB/Hz]) of the transmission line, and the contact positions of the calibration standard are input, the computer automatically calculates the calibration standard characteristics at each position on the basis of equations 1 to 3, which can be used in calibration calculations using equations 10 to 13. In short, the network analyzer is enabled to automatically estimate the values of the calibration standard and perform RRRR calibration.

In a device inspection process performed at a mass production factory, an operator or the like need not calculate the values of the calibration standard, and the RRRR calibration can be performed with the measuring device alone. Thus, the process can be simplified.

Embodiment 6

The residual inductance of the calibration standard (e.g., short standard) may have a large influence due to high frequencies, and, even when the calibration standard is connected to the transmission line, the transmission line may not be sufficiently shorted (signal passes from one port to the other and no total reflection is achieved).

Figure 15:
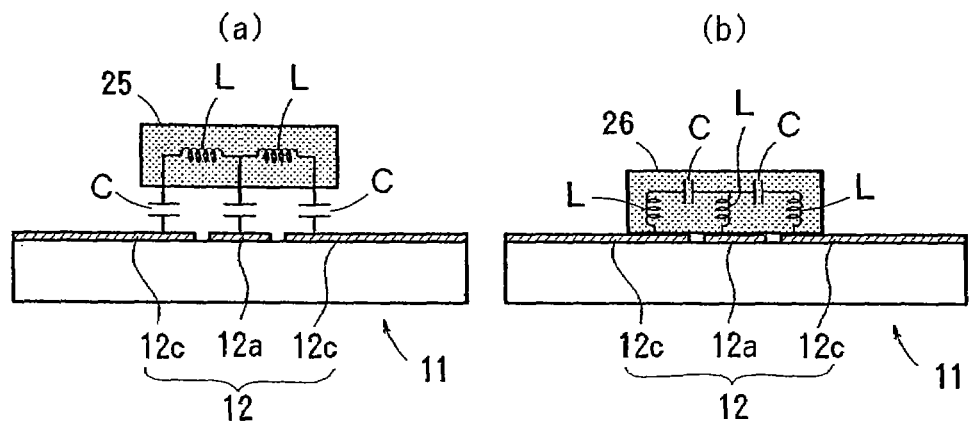
FIGS. 15 (a) and (b) are schematic diagrams showing examples in which series resonance is produced between a calibration standard and a transmission line.

In this case, as shown in portion (a) of FIG. 15, it is preferable that a calibration standard 25 be placed above the transmission line 12 with a space therebetween, and that the capacitance C[F] generated between the transmission line and the calibration standard and the residual inductance L[H] of the calibration standard be in a series resonance state. In this case, it is set to satisfy $C = 1/(2\pi f_s \sqrt{L})$.

Instead of using the stray capacitance between the calibration standard and the transmission line, as shown in portion (b) of FIG. 15, a calibration standard 26 may be placed in contact with the transmission line 12, thereby producing series resonance. In this case, the calibration standard 26 may be a capacitor with a very small capacitance.

In the series resonance state, the impedance of a portion in contact with the calibration standard is 0Ω, that is, an ideal short-circuited state is achieved. In other words, even at high frequencies where a satisfactory short standard is not obtained, the same advantage as that of using a satisfactory short standard can be achieved.

Embodiment 7

Figure 16:
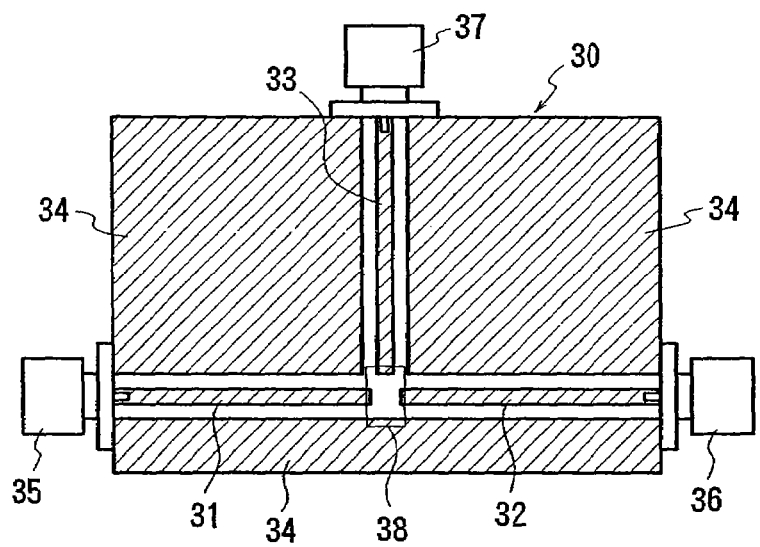
FIG. 16 is a plan view showing an example of a transmission line with three ports.

FIG. 16 shows an example of a measuring fixture with three ports.

In the drawing, reference numeral 30 denotes a measuring fixture; reference numerals 31, 32, 33 denote three signal conductors disposed on the top surface of the measuring fixture 30; reference numeral 34 denotes ground conductors disposed so as to have the signal conductors 31, 32, 33 therebetween, reference numeral 35, 36, 37 denote connectors disposed at ends of the measuring fixture 30. First ends of the signal conductors 31, 32, 33 are adjacent to one another and face one another, and second ends of the signal conductors 31, 32, 33 are connected to the connectors 35, 36, 37, respectively. A calibration standard is connected between each of the signal conductors 31, 32, 33 and the ground conductors 34, and calibration is performed. Thereafter, a test object 38 is connected among the signal conductors 31, 32, 33 or among the signal conductors 31, 32, 33 and the ground conductors 34, and electrical characteristics are measured.

In this way, the electrical characteristics of the test object 38 with three or more terminals can be measured.

Embodiment 8

Figure 17:
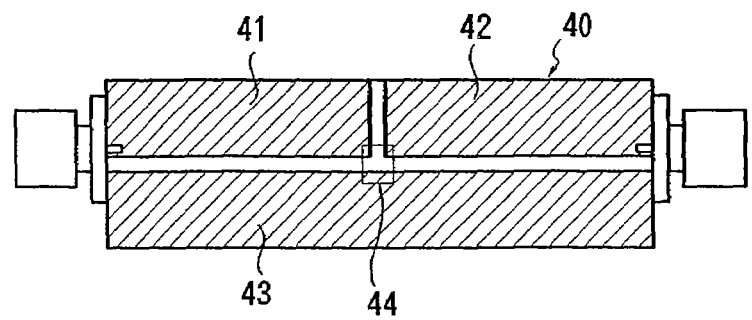
FIG. 17 is a plan view of an example in which a slot line is used as a transmission line.

In the above embodiments, cases in which the coplanar waveguide is used as the transmission line have been described. Alternatively, as shown in FIG. 17, a slot line 40 may be used. The slot line 40 includes signal conductors 41 and 42 and a ground conductor 43, which are disposed on the same plane with a space therebetween. In this case, a test object 44 is connected between the signal conductors 41 and 42 or among the signal conductors 41 and 42 and the ground conductor 43, and electrical characteristics are measured.

The high-frequency electrical characteristic measuring method according to the present invention is not limited to the above embodiments.

The measuring device of the present invention is not limited to the network analyzer. Any device that can measure high-frequency electrical characteristics can be used as the measuring device.

Although the calibration standard is measured at the test object measurement position, the calibration standard need not be measured at the test object measurement position. In this case, three or more measurements of the calibration standard are all expressed using equation 1.

The transmission line is not limited to the planar transmission line. A transmission line with an arbitrary structure can be used as long as the calibration standard can be connected thereto, the through chip can be connected in series therewith, and the test object can be connected between the signal conductors or among the signal conductors and the ground conductor(s).

Although the cases in which the measuring fixtures with one port to three ports are used have been described by way of example, a measuring fixture with four or more ports can be used. In this case, similar calibration and measurement can be performed.

As has been described above, a high-frequency electrical characteristic measuring method according to examples of the present invention has the following advantages.

(1) Since a transmission line for use in calibration is the same as a transmission line for use in measuring a test object, the method is less likely to be influenced by variations of the transmission line. Connections between the transmission line and a measuring device are fixed in calibration and in the actual measurement, and there is no need to establish a reconnection. There will be no calibration failures or the like due to poor contact with the transmission line or the like.

(2) Highly accurate measurement of characteristics of a test object alone can be made, without being influenced by errors of a fixture or the like. In particular, the accuracy of measuring an electronic device with an impedance higher than the characteristic impedance of the transmission line is high.

(3) Not only an electronic device with two terminals, but also an electronic device with three or more terminals serving as a test object can be measured, and devices that can be measured are not limited. Hence, the method is highly effective in accurately measuring scattering parameters or the impedance of an electronic device such as a filter, a coupler, a balun, or the like, or an impedance device such as a chip inductor, a chip capacitor, or the like.

Although the present invention has been described in relation to particular embodiments thereof, many other variations and modifications and other uses will become apparent to those skilled in the art. Therefore, the present invention is not limited by the specific disclosure herein.

The invention claimed is:

1. A method for measuring high-frequency characteristics of an electronic device, the method comprising the steps of:
preparing a transmission line whose electrical characteristics per unit length are known, the transmission line including a plurality of signal conductors disposed with a space therebetween, and at least one ground conductor;
connecting the signal conductors and the ground conductor to associated measurement ports of a measuring device;
measuring, at least three points in the longitudinal direction of each signal conductor, an electrical characteristic in a connection state where each signal conductor is connected to the ground conductor;
measuring electrical characteristics in a through state between the signal conductors;
obtaining error factors of a measurement system including the transmission line on the basis of measured values in the connection state, measured values in the through state, and the electrical characteristics of the transmission line;
connecting the electronic device to be measured between the signal conductors or among the signal conductors and the ground conductor and measuring electrical characteristics; and
removing the error factors of the measurement system from measured values of the electronic device to be measured and obtaining true values of the electrical characteristics of the electronic device to be measured.

2. A method for measuring high-frequency characteristics of an electronic device, the method comprising the steps of:
preparing a transmission line whose electrical characteristics per unit length are unknown, the transmission line including a plurality of signal conductors disposed with a space therebetween, and at least one ground conductor;
connecting the signal conductors and the ground conductor to associated measurement ports of a measuring device;
measuring, at least four points in the longitudinal direction of each signal conductor, an electrical characteristic in a connection state where each signal conductor is connected to the ground conductor;
measuring electrical characteristics in a through state between the signal conductors;
obtaining error factors of a measurement system including the transmission line and the electrical characteristics of the transmission line on the basis of measured values in the connection state and measured values in the through state;
connecting the electronic device to be measured between the signal conductors or among the signal conductors and the ground conductor and measuring electrical characteristics; and
removing the error factors of the measurement system from measured values of the electronic device to be measured and obtaining true values of the electrical characteristics of the electronic device to be measured.

3. A method for measuring high-frequency characteristics of an electronic device, the method comprising the steps of:
preparing a transmission line whose electrical characteristics per unit length are known, the transmission line including a plurality of signal conductors disposed with a space therebetween and at least one ground conductor;
connecting the signal conductors and the ground conductor to associated measurement ports of a measuring device;
measuring, at least three points in the longitudinal direction of each signal conductor, an electrical characteristic in a connection state where each signal conductor is connected to the ground conductor;
connecting the electronic device to be measured between the signal conductors or among the signal conductors and the ground conductor and measuring electrical characteristics;
obtaining error factors of a measurement system including the transmission line on the basis of measured values in the connection state, measured values obtained by connecting the electronic device to be measured, and the electrical characteristics of the transmission line; and
removing the error factors of the measurement system from the measured values of the electronic device to be measured and obtaining true values of the electrical characteristics of the electronic device to be measured.

4. A method for measuring high-frequency characteristics of an electronic device, the method comprising the steps of:
preparing a transmission line whose electrical characteristics per unit length are unknown, the transmission line including a plurality of signal conductors disposed with a space therebetween, and at least one ground conductor;
connecting the signal conductors and the ground conductor to associated measurement ports of a measuring device;
measuring, at least four points in the longitudinal direction of each signal conductor, an electrical characteristic in a connection state where each signal conductor is connected to the ground conductor;
connecting the electronic device to be measured between the signal conductors or among the signal conductors and the ground conductor and measuring electrical characteristics;
obtaining error factors of a measurement system including the transmission line and the electrical characteristics of the transmission line on the basis of measured values in the connection state and measured values obtained by connecting the electronic device to be measured; and
removing the error factors of the measurement system from the measured values of the electronic device to be measured and obtaining true values of the electrical characteristics of the electronic device to be measured.

5. The high-frequency electrical characteristic measuring method according to any one of claims 1 to 4, wherein a short standard is brought into contact with each signal conductor and the ground conductor in order to connect each signal conductor to the ground conductor.

6. The high-frequency electrical characteristic measuring method according to any one of claims 1 to 4, wherein the step of measuring the electrical characteristic in the connection state where each signal conductor is connected to the ground conductor is performed in a state where a through chip is connected between the signal conductors.

7. The high-frequency electrical characteristic measuring method according to claim 6, further comprising a substep of measuring a transmission parameter in the state where the through chip is connected between the signal conductors and in the connection state where each signal conductor is connected to the ground conductor, and detecting poor contact in the connection state on the basis of the measured transmission parameter.

8. The high-frequency electrical characteristic measuring method according to any one of claims 1 to 4, wherein a calibration standard is brought into contact or near contact with each signal conductor and the ground conductor in order to connect each signal conductor to the ground conductor, and series resonance is produced between capacitance of the calibration standard or capacitance between the calibration standard and the transmission line and residual inductance of the calibration standard.

9. The high-frequency electrical characteristic measuring method according to claim 1, wherein a through chip whose transmission parameters have no directivity is connected in series between the signal conductors in order to achieve the through state.

10. The high-frequency electrical characteristic measuring method according to any one of claims 1 to 4, wherein, in addition to the measured values in the connection state and the through state, measured values obtained in an open state of the transmission line are used to obtain the error factors of the measurement system.

11. The high-frequency electrical characteristic measuring method according to any one of claims 1, 2, and 9, wherein the step of obtaining the error factors of the measurement system including the transmission line is executed using the following equations:

$$D_1 = \Gamma_{A2}\Gamma_{A3}S_{11M3} - \Gamma_{A1}\Gamma_{A3}S_{11M3} - \Gamma_{A2}\Gamma_{A3}S_{11M2} + \quad \text{[Eq. 10]}$$
$$\Gamma_{A1}\Gamma_{A2}S_{11M2} + \Gamma_{A1}\Gamma_{A3}S_{11M1} - \Gamma_{A1}\Gamma_{A2}S_{11M1}$$

$$E_{11} = -(\Gamma_{A1}\Gamma_{A3}S_{11M2}S_{11M3} - \Gamma_{A1}\Gamma_{A3}S_{11M2}S_{11M3} -$$
$$\Gamma_{A2}\Gamma_{A3}S_{11M1}S_{11M3} + \Gamma_{A1}\Gamma_{A2}S_{11M1}S_{11M3} +$$
$$\Gamma_{A2}\Gamma_{A3}S_{11M1}S_{11M2} - \Gamma_{A1}\Gamma_{A3}S_{11M1}S_{11M2})/D_1$$

$$E_{21}E_{12} = \frac{(\Gamma_{A2} - \Gamma_{A1})(\Gamma_{A2} - \Gamma_{A1})(\Gamma_{A2} - \Gamma_{A1})}{(S_{11M2} - S_{11M1})(S_{11M3} - S_{11M1})(S_{11M3} - S_{11M2})}{D_1^2}$$

$$E_{22} = \frac{\Gamma_{A2}S_{11M3} - \Gamma_{A1}S_{11M3} - \Gamma_{A2}S_{11M3} + \Gamma_{A3}S_{11M2} + \Gamma_{A3}S_{11M1} - \Gamma_{A2}S_{11M1}}{D_1}$$

$$\frac{S_{21MT}}{S_{12MT}} = \frac{E_{21}F_{12}}{F_{21}E_{12}} \quad \text{[Eq. 12]}$$

$$E_{21} = 1 \quad \text{[Eq. 13]}$$
$$E_{12} = (E_{21}E_{12})/E_{21}$$
$$F_{12} = \sqrt{(E_{21}E_{12})(F_{21}F_{12})S_{21MT}/S_{12MT}}$$
$$F_{12} = (F_{21}F_{12})/F_{12}$$

where $\Gamma_{A1}$ is a reflection parameter at a first measurement position, $\Gamma_{A2}$ is a reflection parameter a second measurement position, $\Gamma_{A3}$ is a reflection parameter at a third measurement position, $S_{11M1}$ is a measured value at the first measurement position, $S_{11M2}$ is a measured value at the second measurement position, $S_{11M3}$ is a measured value at the third measurement position, $S_{11MT}$ is a reflection parameter in the through state, $S_{21MT}$ is a transmission parameter in the through state, and $E_{xx}$ and $F_{xx}$ are the error factors of the measurement system.

12. The high-frequency electrical characteristic measuring method according to claim 11, wherein the step of removing the error factors of the measurement system from the measured values of the electronic device to be measured and obtaining the true values of the electrical characteristics of the electronic device to be measured is executed using the following equations:

$$D_2 = \left\{\frac{E_{22}(S_{11M} - E_{11})}{E_{12}} + 1\right\}\left\{\frac{F_{22}(S_{22M} - F_{11})}{F_{12}} + 1\right\} - \quad \text{[Eq. 14]}$$
$$\frac{F_{22}F_{11}S_{12M}S_{21M}}{F_{12}E_{12}}$$

$$S_{11A} = \frac{(S_{11M} - E_{11})\{F_{22}(S_{22M} - F_{11})/F_{12} + 1\}/F_{22}S_{12M}S_{21M}/(F_{12}E_{12})}{D_2}$$

$$S_{21A} = \frac{S_{21A}/F_{12}\{(F_{22} - F_{22})(S_{22M} - F_{11})/F_{12} + 1\}}{D_2}$$

where $S_{11A}$ is a reflection parameter of the electronic device to be measured, and $S_{21A}$ is a transmission parameter of the electronic device to be measured.

13. The high-frequency electrical characteristic measuring method according to any one of claims 1 to 4, wherein the transmission line includes the signal conductors and the ground conductor disposed on the same plane.

14. The high-frequency electrical characteristic measuring method according to claim 13, wherein the transmission line is a coplanar waveguide including the signal conductors and the ground conductors having the signal conductors therebetween.

15. The high-frequency electrical characteristic measuring method according to claim 13, wherein the transmission line is a slot line including the signal conductors and the ground conductor disposed with a space therebetween.

16. The high-frequency electrical characteristic measuring method according to any one of claims 1 to 4, wherein each position at which the electrical characteristic is measured in the connection state where each signal conductor is connected to the ground conductor is a position at which a phase difference between the positions is between 70° and 145°.

17. An apparatus for measuring high-frequency characteristics of an electronic device, the apparatus comprising:
    a transmission line whose electrical characteristics per unit length are known, the transmission line including a plurality of signal conductors disposed with a space therebetween and at least one ground conductor;
    a measuring device that can measure high-frequency electrical characteristics, the measuring device including measurement ports connected to the signal conductors and at least one measurement ports connected to the ground conductor;
    means for establishing a connection state where each signal conductor is connected to the ground conductor at least three points in the longitudinal direction of each signal conductor;

means for establishing a through state between the signal conductors;

means for obtaining error factors of a measurement system including the transmission line on the basis of measured values in the connection state, measured values in the through state, and the electrical characteristics of the transmission line;

means for connecting the electronic device to be measured between the signal conductors or among the signal conductors and the ground conductor; and means for removing the error factors of the measurement system from measured values obtained by connecting the electronic device to be measured between the signal conductors or among the signal conductors and the ground conductor, and obtaining true values of the electrical characteristics of the electronic device to be measured.

18. An apparatus for measuring high-frequency characteristics of an electronic device, the apparatus comprising:

a transmission line whose electrical characteristics per unit length are unknown, the transmission line including a plurality of signal conductors disposed with a space therebetween and at least one ground conductor;

a measuring device that can measure high-frequency electrical characteristics, the measuring device including measurement ports connected to the signal conductors and at least one measurement ports connected to the ground conductor;

means for establishing a connection state where each signal conductor is connected to the ground conductor at least four points in the longitudinal direction of each signal conductor;

means for establishing a through state between the signal conductors;

means for obtaining error factors of a measurement system including the transmission line and the electrical characteristics of the transmission line on the basis of measured values in the connection state and measured values in the through state;

means for connecting the electronic device to be measured between the signal conductors or among the signal conductors and the ground conductor; and means for removing the error factors of the measurement system from measured values obtained by connecting the electronic device to be measured between the signal conductors or among the signal conductors and the ground conductor, and obtaining true values of the electrical characteristics of the electronic device to be measured.

19. The high-frequency electrical characteristic measuring apparatus according to claim 17 or 18 wherein the means for establishing the connection state where each signal conductor is connected to the ground conductor includes a short standard and means for bringing the short standard into contact with the transmission line.

20. The high-frequency electrical characteristic measuring apparatus according to claim 17 or 18, wherein the means for establishing the through state includes a through chip whose transmission parameters have no directivity and means for connecting the through chip in series with the transmission line.

21. A method for calibrating an apparatus for measuring high-frequency electrical characteristics of an electronic device, the method comprising the steps of:

preparing a transmission line whose electrical characteristics per unit length are known, the transmission line including a plurality of signal conductors disposed with a space therebetween and at least one ground conductor;

connecting the signal conductors and the ground conductor to associated measurement ports of a measuring device;

measuring, at least three points in the longitudinal direction of each signal conductor, an electrical characteristic in a connection state where each signal conductor is connected to the ground conductor;

measuring electrical characteristics in a through state between the signal conductors; and obtaining error factors of a measurement system including the transmission line on the basis of measured values in the connection state, measured values in the through state, and the electrical characteristics of the transmission line.

22. A method for calibrating an apparatus for measuring high-frequency electrical characteristics of an electronic device, the method comprising the steps of:

preparing a transmission line whose electrical characteristics per unit length are unknown, the transmission line including a plurality of signal conductors disposed with a space therebetween and at least one ground conductor;

connecting the signal conductors and the ground conductor to associated measurement ports of a measuring device;

measuring, at least four points in the longitudinal direction of each signal conductor, an electrical characteristic in a connection state where each signal conductor is connected to the ground conductor;

measuring electrical characteristics in a through state between the signal conductors; and obtaining error factors of a measurement system including the transmission line and the electrical characteristics of the transmission line on the basis of measured values in the connection state and measured values in the through state.

23. In combination, an electronic device having a high-frequency electrical characteristic to be measured, said electronic device being connected to the apparatus set forth in claim 17 or 18.

24. The high-frequency electrical characteristic measuring method according to claim 5, wherein the step of measuring the electrical characteristic in the connection state where each signal conductor is connected to the ground conductor is performed in a state where a through chip is connected between the signal conductors.

25. The high-frequency electrical characteristic measuring apparatus according to claim 19, wherein the means for establishing the through state includes a through chip whose transmission parameters have no directivity and means for connecting the through chip in series with the transmission line.

* * * * *